(12) United States Patent
Maeda et al.

(10) Patent No.: US 10,714,351 B2
(45) Date of Patent: Jul. 14, 2020

(54) MULTI-LAYERED SUBSTRATE MANUFACTURING METHOD

(71) Applicants: Hidehiro Maeda, Yokohama (JP); Satoshi Katagiri, Yokohama (JP)

(72) Inventors: Hidehiro Maeda, Yokohama (JP); Satoshi Katagiri, Yokohama (JP)

(73) Assignee: Nikon Corporation, Tokyo (JP)

(*) Notice: Subject to any disclaimer, the term of this patent is extended or adjusted under 35 U.S.C. 154(b) by 292 days.

(21) Appl. No.: 13/761,348

(22) Filed: Feb. 7, 2013

(65) Prior Publication Data

US 2013/0157438 A1    Jun. 20, 2013

Related U.S. Application Data

(60) Division of application No. 12/769,218, filed on Apr. 28, 2010, now Pat. No. 9,015,930, which is a
(Continued)

(30) Foreign Application Priority Data

| Oct. 30, 2007 | (JP) | ................................. 2007-281200 |
| Aug. 1, 2008 | (JP) | ................................. 2008-199553 |
| Aug. 1, 2008 | (JP) | ................................. 2008-199554 |

(51) Int. Cl.
*H01L 21/30* (2006.01)
*H05K 3/00* (2006.01)
(Continued)

(52) U.S. Cl.
CPC .......... *H01L 21/30* (2013.01); *H01L 21/2007* (2013.01); *H01L 21/67092* (2013.01);
(Continued)

(58) Field of Classification Search
CPC ............... H01L 21/30; H01L 21/67092; H01L 2924/00; H01L 2924/0002; H01L 21/2007;
(Continued)

(56) References Cited

U.S. PATENT DOCUMENTS 5,297,480 A * 3/1994 Miyashita ............ H05K 3/4611
100/320
5,370,301 A    12/1994 Belcher et al.
(Continued)

FOREIGN PATENT DOCUMENTS

| JP | 2003-332403 A | 11/2003 |
| JP | 2005-339706 A | 12/2005 |

(Continued)

OTHER PUBLICATIONS

Office Action, issued from the Taiwan Patent Office in corresponding Application No. 097141402, dated Oct. 24, 2013, (11 pages).
(Continued)

*Primary Examiner* — A. Dexter Tugbang
(74) *Attorney, Agent, or Firm* — Finnegan, Henderson, Farabow, Garrett & Dunner, L.L.P.

(57) ABSTRACT

Provided is a substrate holding unit that holds a pair of substrates that are aligned and layered, comprising a first holding member that holds one of the substrates; a plurality of members to be joined that are connected to the first holding member; a second holding member that holds the other of the substrates to face the one of the substrates; a plurality of joining members that exert an adhesion force on the members to be joined and are connected to the second holding member at positions corresponding to positions of the members to be joined; and an adhesion restricting section that restricts the adhesion force until the substrates are aligned.

16 Claims, 44 Drawing Sheets

Related U.S. Application Data continuation of application No. PCT/JP2008/069793, filed on Oct. 30, 2008.

(51) Int. Cl.

| | | |
|---|---|---|
| *H05K 3/46* | (2006.01) | |
| *H05K 13/00* | (2006.01) | |
| *H05K 3/38* | (2006.01) | |
| *H05K 3/32* | (2006.01) | |
| *H01L 21/20* | (2006.01) | |
| *H01L 21/683* | (2006.01) | |
| *H01L 21/67* | (2006.01) | |
| *B32B 38/18* | (2006.01) | |
| *B32B 7/12* | (2006.01) | |
| *B32B 37/10* | (2006.01) | |

(52) U.S. Cl.
CPC ........ *H01L 21/683* (2013.01); *H01L 21/6831* (2013.01); *H05K 3/0061* (2013.01); *H05K 3/0067* (2013.01); *H05K 3/321* (2013.01); *H05K 3/325* (2013.01); *H05K 3/386* (2013.01); *H05K 3/4611* (2013.01); *H05K 3/4638* (2013.01); *H05K 13/0015* (2013.01); *B32B 7/12* (2013.01); *B32B 37/10* (2013.01); *B32B 38/1833* (2013.01); *H01L 2924/00* (2013.01); *H01L 2924/0002* (2013.01); *Y10T 29/4913* (2015.01); *Y10T 29/49126* (2015.01); *Y10T 29/5313* (2015.01); *Y10T 29/53196* (2015.01); *Y10T 156/10* (2015.01)

(58) Field of Classification Search
CPC . H01L 21/683; H01L 21/6831; Y10T 156/10; Y10T 29/49126; Y10T 29/4913; Y10T 29/53196; Y10T 29/5313; H05K 3/386; H05K 3/4611; H05K 3/4368; H05K 13/0015; H05K 3/321; H05K 3/325; H05K 3/0061; H05K 3/0069; H05K 3/4638; H05K 3/0067; B32B 7/12; B32B 37/10; B32B 38/1833

See application file for complete search history.

(56) References Cited

U.S. PATENT DOCUMENTS

| | | | |
|---|---|---|---|
| 5,460,320 A | 10/1995 | Belcher et al. | |
| 6,168,442 B1 * | 1/2001 | Naoi | H05K 3/325 |
| | | | 439/66 |
| 6,274,508 B1 | 8/2001 | Jacobsen et al. | |
| 6,299,713 B1 * | 10/2001 | Bejtlich | H05K 13/0015 |
| 6,465,084 B1 * | 10/2002 | Curcio et al. | H05K 3/386 |
| 7,926,176 B2 | 4/2011 | Huber et al. | |
| 7,931,063 B2 | 4/2011 | Craig et al. | |
| 8,138,868 B2 | 3/2012 | Arnold | |
| 2003/0106799 A1 * | 6/2003 | Covington | B32B 37/10 |
| | | | 204/600 |
| 2005/0018122 A1 * | 1/2005 | Hong | B32B 37/10 |
| | | | 349/153 |
| 2007/0055621 A1 | 3/2007 | Tischler et al. | |
| 2007/0087472 A1 | 4/2007 | Huber et al. | |
| 2009/0016857 A1 | 1/2009 | Nakamura | |
| 2009/0141418 A1 * | 6/2009 | Hwang | H01L 21/67092 |
| | | | 361/234 |

FOREIGN PATENT DOCUMENTS

| | | |
|---|---|---|
| JP | 2006-339191 | 12/2006 |
| JP | 2007-158199 A | 6/2007 |
| JP | 2007194532 A * | 8/2007 |
| TW | 2007-34263 | 9/2007 |

OTHER PUBLICATIONS

Notification of Second Office Action, dated Apr. 26, 2012 by Chinese Patent Office in Chinese Patent Application No. 200880114438.5.

Notice of Reasons for Rejection issued by the Japanese Patent Office dated Feb. 12, 2014, in corresponding Japanese Application No. JP 2013-022653, 2 pgs.

Office Action dated Feb. 9, 2015 in corresponding Korean Patent Application No. 10-2010-7008583, with English translation, 11 pages.

Notice of Preliminary Rejection dated Aug. 26, 2015 from Korean Intellectual Property Office in corresponding Korean Patent Application No. 10-2010-7008583, with English translation.

Office Action dated May 4, 2015 in corresponding Chinese Patent Application No. 201310072650.2, with English translation, 17 pages.

* cited by examiner

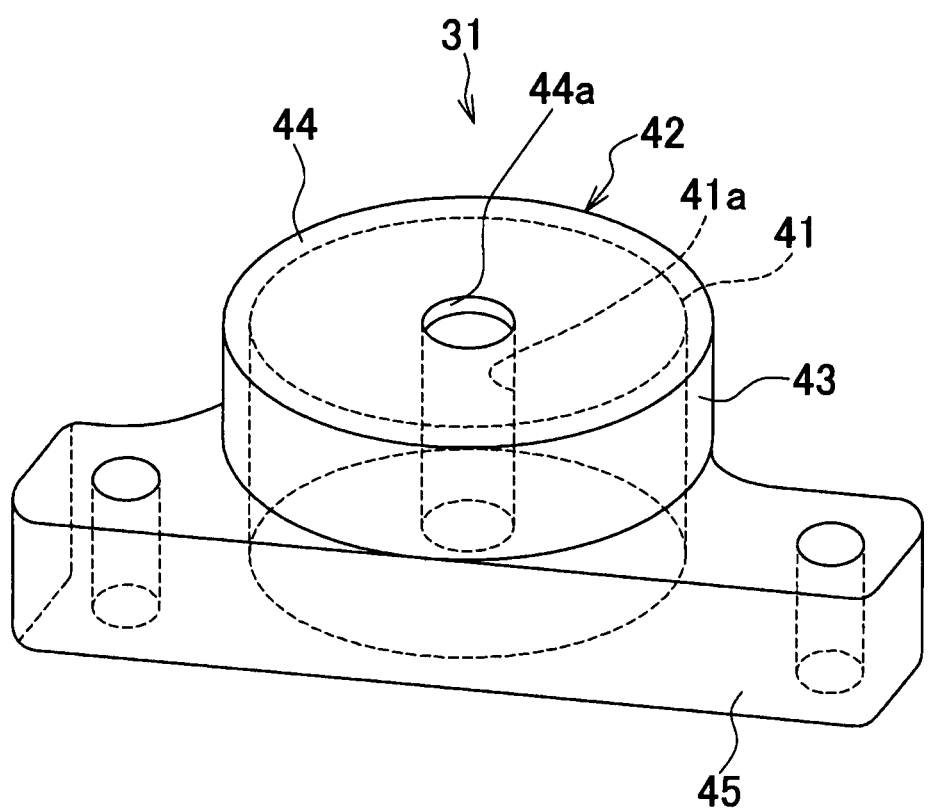
F I G . 9

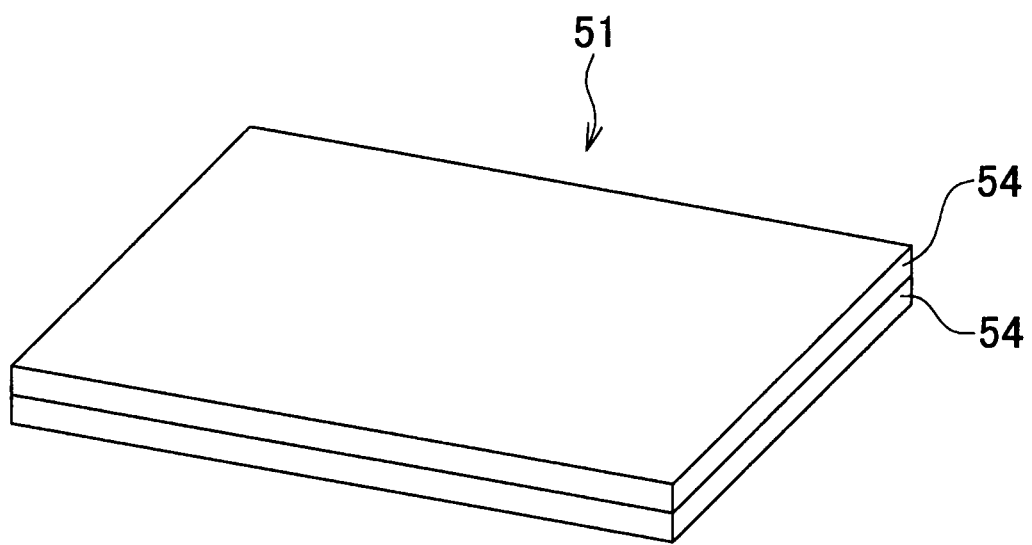
F I G . 12

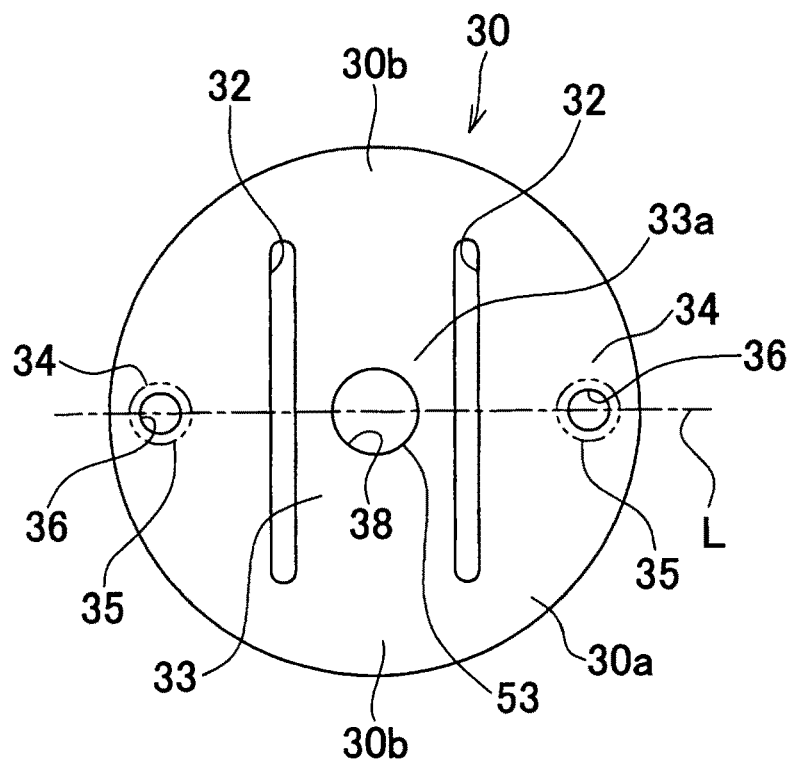
F I G. 13A
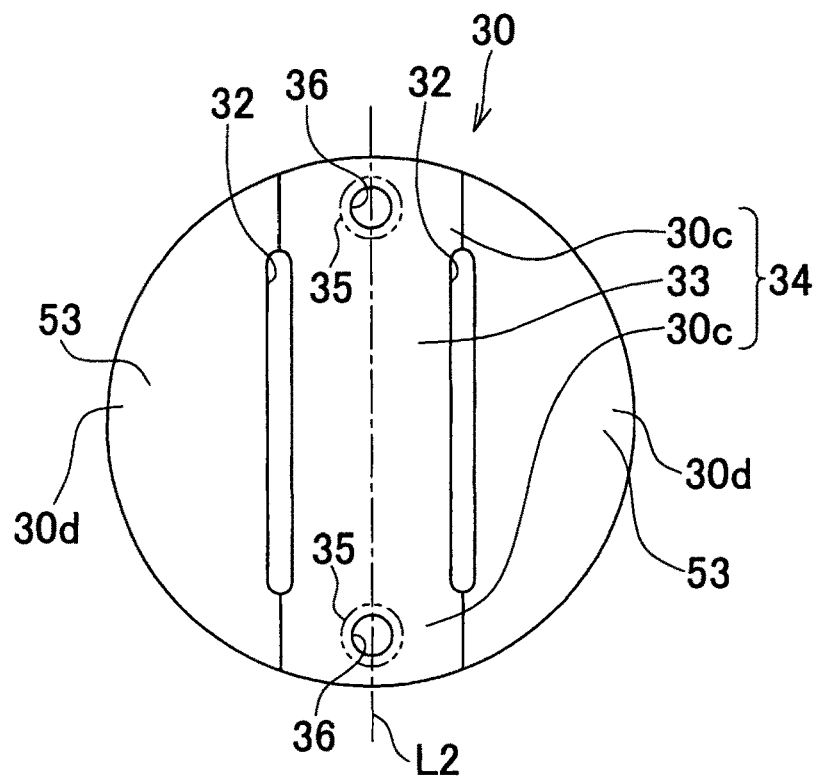
F I G. 13B

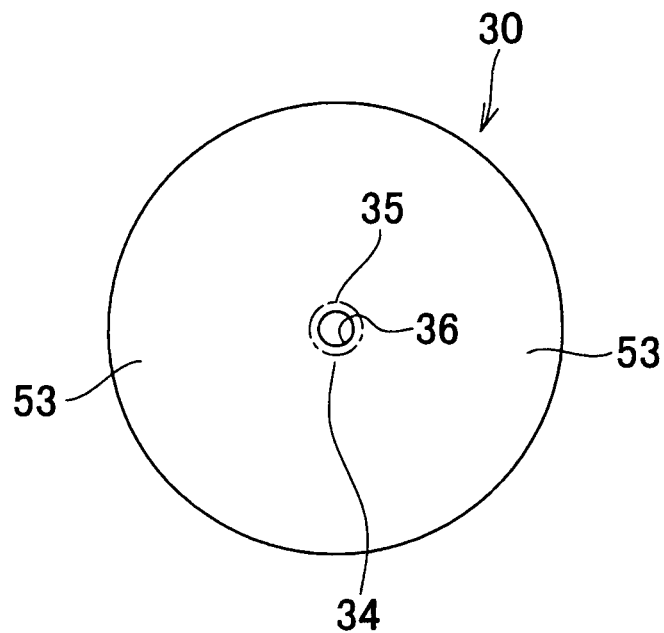
F I G . 14A
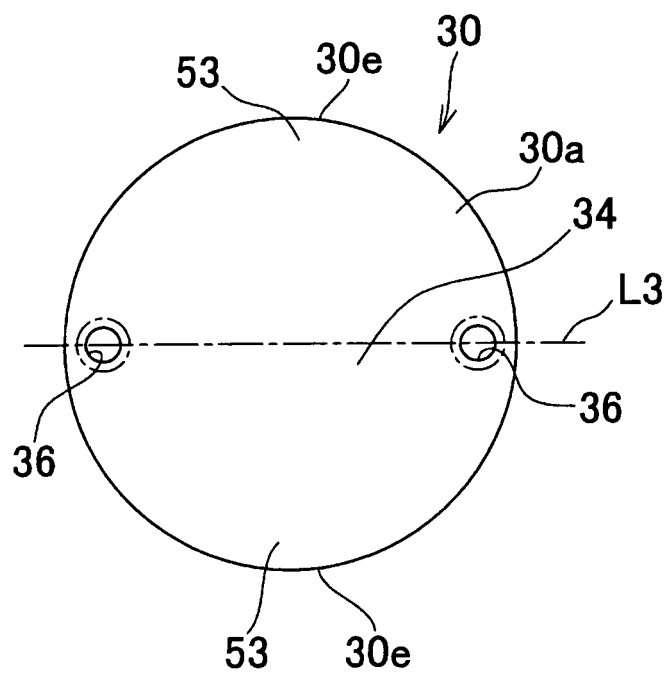
F I G . 14B

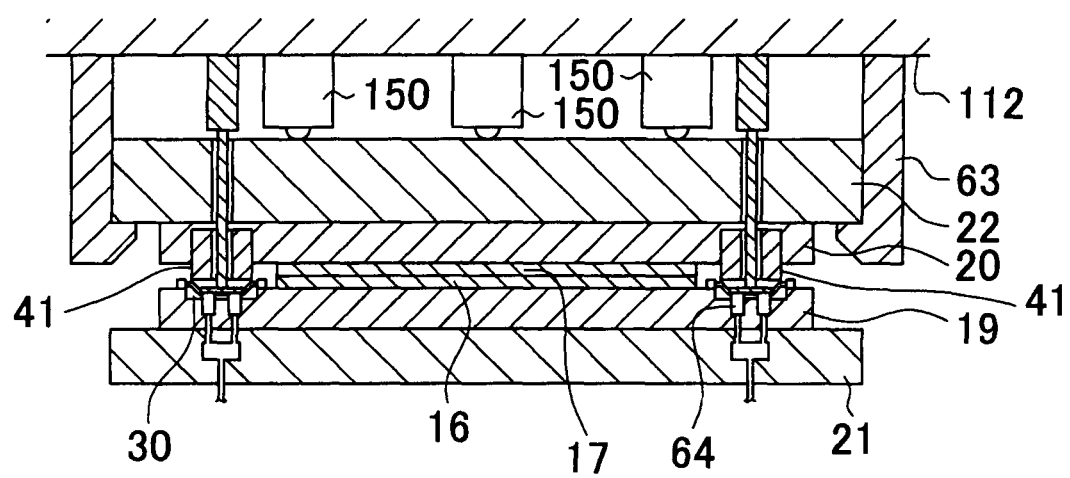
F I G . 22

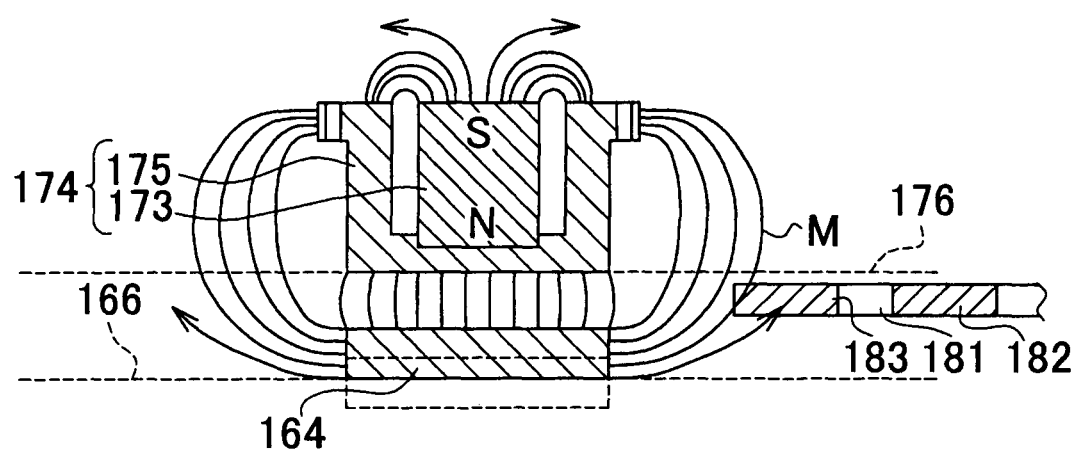
F I G . 32

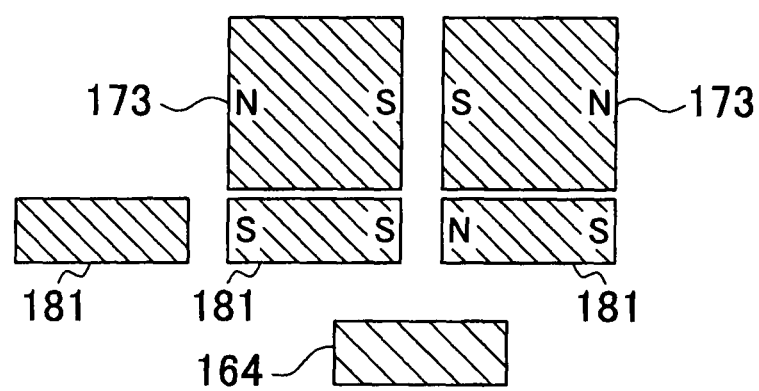
F I G . 38

MULTI-LAYERED SUBSTRATE MANUFACTURING METHOD

CROSS REFERENCE TO RELATED APPLICATIONS

This is a division of application Ser. No. 12/769,218 (now U.S. Pat. No. 9,015,930), filed Apr. 28, 2010, which is a continuation of PCT International Application No. PCT/JP2008/069793, filed Oct. 30, 2008, which claims the priority of Japanese Patent Application Nos. 2007-281200, filed Oct. 30, 2007, 2008-199553, filed Aug. 1, 2008 and 2008-199554, filed Aug. 1, 2008, the contents of all of which are incorporated herein by reference.

BACKGROUND

1. Technical Field

The present invention relates to a substrate holding unit, a substrate bonding apparatus, a multi-layered substrate manufacturing apparatus, a substrate bonding method, a multi-layered substrate manufacturing method, and a multi-layered semiconductor apparatus manufacturing method. The contents of the following patent applications are incorporated herein by reference:

No. 2007-281200 filed on Oct. 30, 2007
No. 2008-199553 filed on Aug. 1, 2008
No. 2008-199554 filed on Aug. 1, 2008

2. Related Art

One technique for improving the effective packing density of a semiconductor apparatus involves using a configuration with a plurality of layered dies. A layered semiconductor module in which dies are layered prior to packaging not only has improved packing density of the circuits and elements therein, but also has shorter wiring between the chips to enable faster processing. Furthermore, when manufacturing a layered semiconductor module, there are cases in which the bonding is performed in units of dies, but the throughput can be improved by dicing the layered modules after bonding in units of wafers.

A wafer serving as the material for the layered semiconductor apparatus has a low thickness relative to its surface area, and so does not have a high mechanical strength. Therefore, in order to handle the wafer without damaging it, the wafer is fixed to a fixing member that has a flat adhesion surface, such that the wafer is handled together with the fixing member. When bonding wafers, the bonding process can be easily achieved by bonding the wafers via the fixing members and holding the bonded wafers between the fixing members.

Japanese Patent Application Publication No. 2006-339191 discloses a pair of wafer holders that each include a joining member generating an adhesion force and that are joined to sandwich the wafers bonded therebetween. As a result, the pair of wafers can be held while maintaining the aligned and bonded state.

However, when using permanent magnets to generate the adhesion force, the permanent magnets exert a continuous adhesion force on the magnetic bodies, and so when adjusting the relative positions of the substrates, the magnetic force affects the alignment. Furthermore, when joining the permanent magnets and the magnetic bodies, the substrates experience a large shock at the moment of adhesion if the attractive force exerted on the magnetic bodies is strong, and this may damage the substrates.

SUMMARY

Therefore, in order to solve the above problems, a first aspect of the present invention provides a substrate holding unit that holds a pair of substrates that are aligned and layered, comprising a first holding member that holds one of the substrates; a plurality of members to be joined that are connected to the first holding member; a second holding member that holds the other of the substrates to face the one of the substrates; a plurality of joining members that exert an adhesion force on the members to be joined and are connected to the second holding member at positions corresponding to positions of the members to be joined; and an adhesion restricting section that restricts the adhesion force until the substrates are aligned, wherein after the substrates are aligned and bonded, the members to be joined and the joining members are adhered to each other.

According to a second aspect of the present invention, provided is a substrate bonding apparatus that aligns and layers a pair of substrates, comprising a first holding member supporting member that supports a first holding member holding one of the substrates; a plurality of members to be joined that are connected to the first holding member; a second holding member supporting member that supports a second holding member holding the other of the substrates to face the one of the substrates; a plurality of joining members that exert an adhesion force on the members to be joined and are connected to the second holding member at positions corresponding to positions of the members to be joined; an alignment drive unit that aligns the substrates with each other; a layering drive unit that drives one of the first holding member supporting member and the second holding member supporting member toward the other; and an adhesion restricting section that restricts the adhesion force until the substrates are aligned, wherein after the substrates are aligned by the alignment drive unit and layered by the layering drive unit, the adhesion restricting section removes the restriction on the adhesion between the members to be joined and the joining members.

According to a third aspect of the present invention, provided is a multi-layered substrate manufacturing apparatus comprising the bonding apparatus described above and a pressuring apparatus that applies pressure to a pair of substrates, which are aligned and layered by the bonding apparatus, to attach the substrates to each other.

According to a fourth aspect of the present invention, provided is a substrate bonding method for aligning and layering a pair of substrates, comprising holding one of the substrates with a first holding member that has a member to be joined; holding the other of the substrates to face the one of the substrates with a second holding member that has a joining member exerting an adhesion force on the member to be joined; aligning the substrates; and using the adhesion force to adhere the member to be joined and the joining member, such that the aligned substrates are held in a layered state between the first holding member and the second holding member.

According to a fifth aspect of the present invention, provided is a layered substrate manufacturing method, comprising, after performing the substrate bonding process described above, applying pressure to the substrates via the first holding member and the second holding member to attach the substrates to each other.

According to a sixth aspect of the present invention, provided is a multi-layered semiconductor apparatus manufacturing method for manufacturing a multi-layered semiconductor apparatus that includes a pair of semiconductor substrates that are layered and that each include elements and electrodes, the method comprising holding one of the semiconductor substrates with a first holding member that has a member to be joined; holding the other of the semiconductor substrates to face the one of the semiconductor substrates with a second holding member that has a joining member exerting an adhesion force on the member to be joined; aligning corresponding electrodes of the semiconductor substrates; using the adhesion force to adhere the member to be joined and the joining member, such that the aligned semiconductor substrates are held in a layered state between the first holding member and the second holding member; and applying pressure to the semiconductor substrates via the first holding member and the second holding member to attach the semiconductor substrates to each other.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 9 is a schematic perspective view of a joining member 31.

FIG. 12 is a schematic perspective view of the multi-layered semiconductor apparatus 51.

FIGS. 13A and 13B are planar views of other flat spring components 30.

FIGS. 14A and 14B are planar views of other flat spring components 30.

FIG. 22 is a cross-sectional view of the bonding mechanism 13 during the next stage in the process for bonding the wafers 16 and 17.

FIG. 32 is a schematic view of the magnetic circuit formed in the state shown in FIG. 31.

FIG. 38 shows the magnetic field control unit 180 according to another embodiment in the non-joining state.

BRIEF DESCRIPTION OF THE DRAWINGS

Hereinafter, some embodiments of the present invention will be described. The embodiments do not limit the invention according to the claims, and all the combinations of the features described in the embodiments are not necessarily essential to means provided by aspects of the invention.

Figure 1:
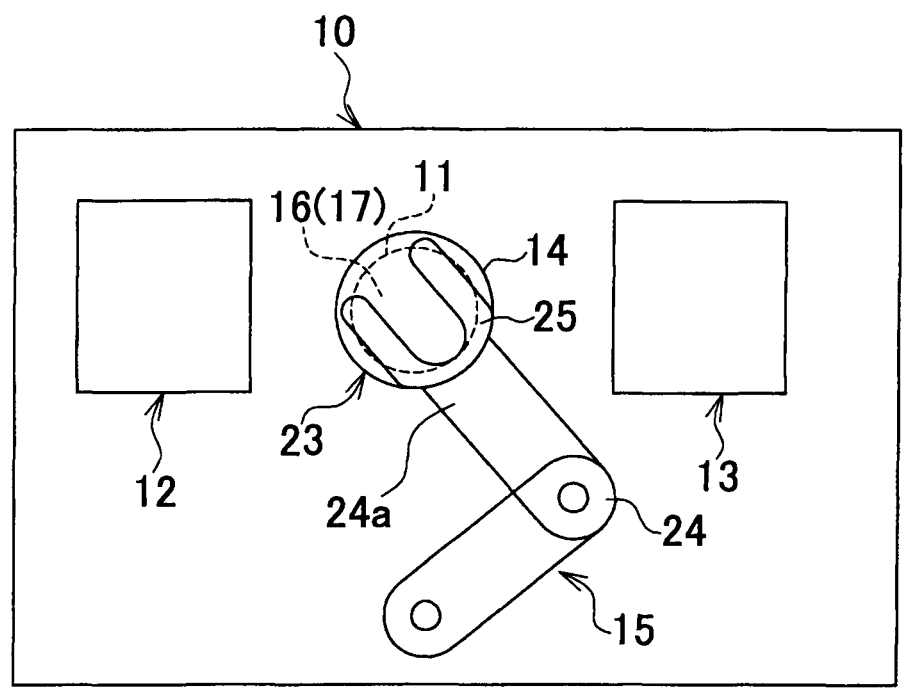
FIG. 1 is a schematic view of a multi-layered substrate manufacturing apparatus 10.

FIG. 1 is a schematic view of a multi-layered substrate manufacturing apparatus 10. The multi-layered substrate manufacturing apparatus 10 includes an alignment mechanism 12 for aligning two substrates 11, although only one substrate 11 is shown in FIG. 1, and a bonding mechanism 13 that bonds the substrates 11 aligned by the alignment mechanism 12 to each other. The multi-layered substrate manufacturing apparatus 10 further includes a substrate holder 14 that holds the substrates 11 aligned by the alignment mechanism 12 in the aligned state and a transport mechanism 15 that transports the substrates 11 held by the substrate holder 14 from the alignment mechanism 12 to the bonding mechanism 13.

Figure 2:
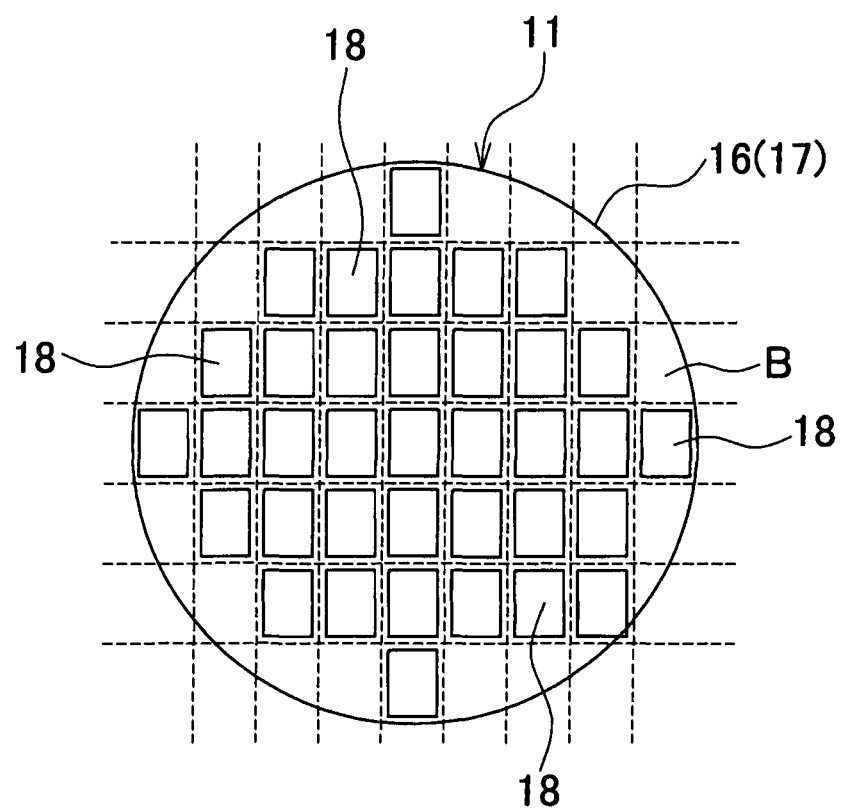
FIG. 2 is a schematic planar view of one of the wafers 16 and 17.

FIG. 2 is a schematic planar view of one of the wafers 16 and 17. In the example of FIG. 2, the two substrates 11 respectively include the wafers 16 and 17. As shown in FIG. 2, each of the wafers 16 and 17 includes circuit elements such as transistors, resistors, and capacitors, not shown, formed as a plurality of small regions 18 defining a matrix on one surface of a circular thin board B made of single-crystal silicon serving as a semiconductor material. These circuit elements are formed using mainly lithography, and other techniques such as thin film formation, etching, or impurity diffusion.

Figure 3A:
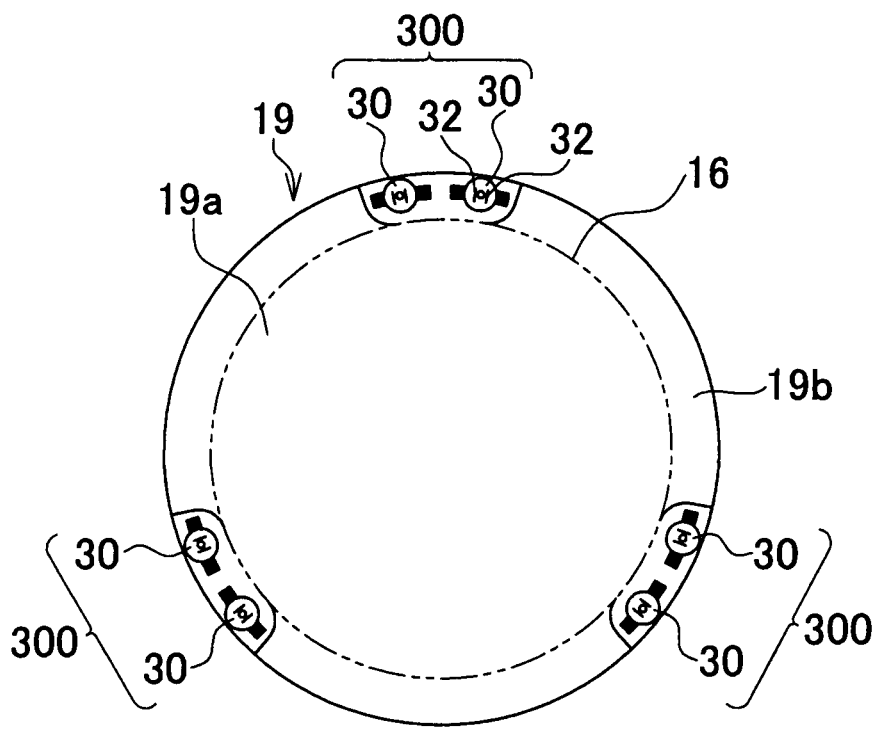
FIG. 3A is a schematic view of the first holder 19.
Figure 3B:
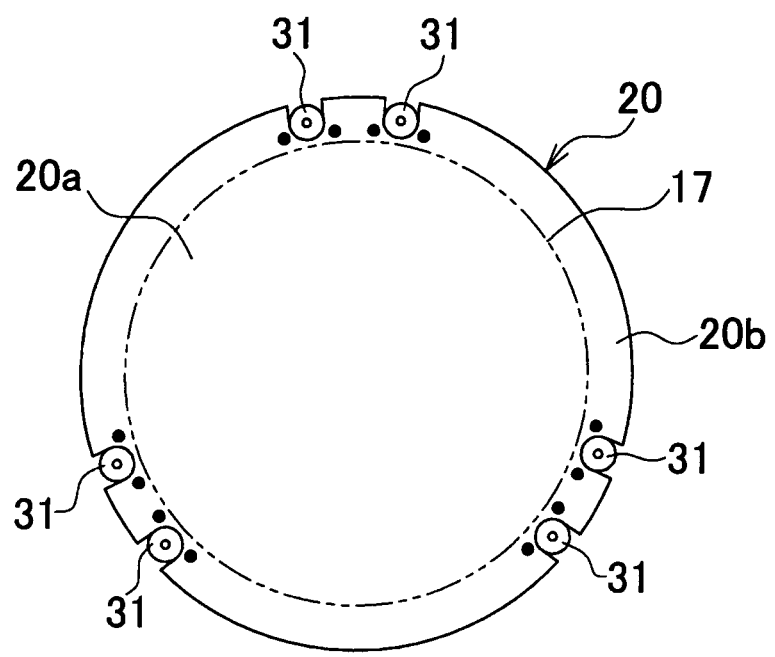
FIG. 3B is a schematic view of the second holder 20.

FIGS. 3A and 3B are planar views of a first holder 19 and a second holder 20. FIG. 3A is a schematic view of the first holder 19 and FIG. 3B is a schematic view of the second holder 20.

As shown in FIGS. 3A and 3B, the substrate holder 14 includes the first holder 19 to hold one of the two wafers 16 and 17, and includes the second holder 20 to hold the other of the wafers 16 and 17.

Figure 4A:
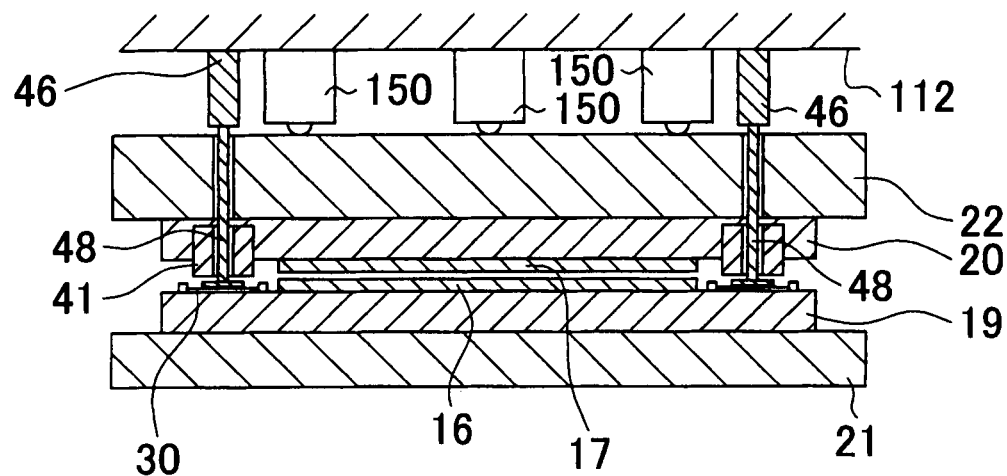
FIGS. 4A and 4B are cross-sectional views of the alignment mechanism 12 showing the operation of the flat spring component 30.
Figure 4B:
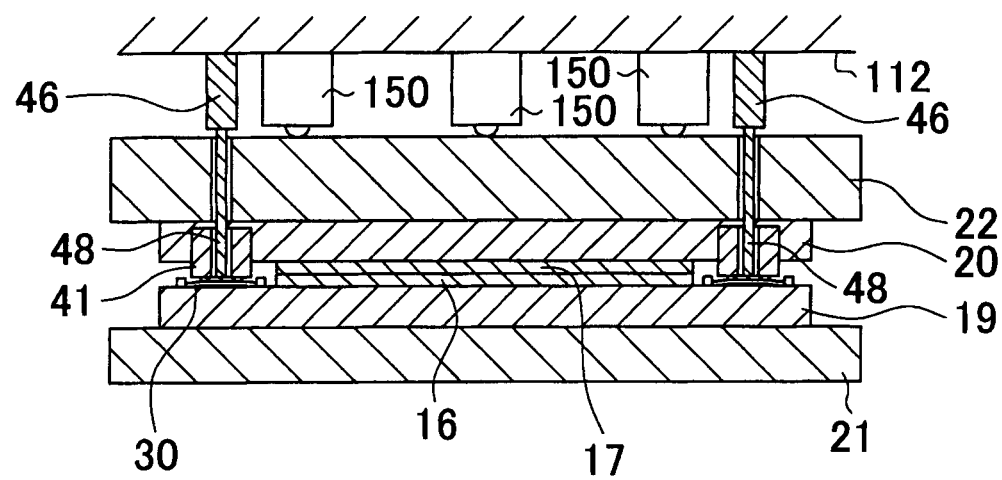

FIGS. 4A and 4B are cross-sectional views of the alignment mechanism 12 showing the operation of the flat spring component 30. FIG. 4A is a schematic view of a state in which the deformation of the flat spring component 30 is restricted, and FIG. 4B is a schematic view in which the restriction on the deformation of the flat spring component 30 is removed.

The first holder 19 and the second holder 20 are each formed as discs. The first holder 19 and the second holder 20 respectively have adhesion surfaces 19a and 20a that adhere to a first surface of the respective wafers 16 and 17 and, as shown in FIGS. 4A and 4B, these adhesion surfaces are arranged to face each other and to overlap with each other in the direction of the board thickness.

The wafers 16 and 17 respectively have second sides 16b and 17b that are opposite the first sides 16a and 17a on which the circuit elements are formed, and the wafers 16 and 17 are respectively adhered to the adhesion surfaces 19a and 20a via these second sides 16b and 17b. The wafers 16 and 17 are adhered to the adhesion surfaces 19a and 20a of the first holder 19 and the second holder 20 by an electrostatic adhesion force generated by the adhesion surfaces 19a and 20a as a result of a voltage being applied to electrodes, not shown, provided on the first holder 19 and the second holder 20. As a result, the wafers 16 and 17 are respectively held integrally with the first holder 19 and the second holder 20 with their first surfaces 16a and 17a on which the circuit elements are formed facing each other.

In FIGS. 4A and 4B, the adhesion positions of the wafers 16 and 17 on the adhesion surfaces 19a and 20a are defined such that (i) the center of each wafer 16 and 17 is aligned with the center of the corresponding first holder 19 and second holder 20 and (ii) when reference marks, not shown, formed respectively on the first holder 19 and the second holder 20 are aligned with each other, as described further below, the arrangements of the small regions 18 in the wafers 16 and 17 are symmetrical with respect to the planar surfaces of the wafers 16 and 17.

As shown in FIGS. 4A and 4B, the alignment mechanism 12 includes a first table 21 that supports the first holder 19 and a second table 22 that supports the second holder 20.

The first table 21 can move in both horizontal and vertical directions as seen from the perspective of FIGS. 4A and 4B.

The second table 22 is suspended from a top plate 112, shown in FIG. 25, of the alignment mechanism 12, and supports the second holder 20 from below. A plurality of pressure detecting sections 150 are inserted between the top plate 112 and the second table 22. The pressure detecting sections 150 detect the pressure between the wafers 16 and 17 when bonding the wafers 16 and 17.

The alignment mechanism 12 detects the reference marks on the first holder 19 and the second holder 20 using, for example, a microscope, not shown, when aligning the wafers 16 and 17 held by the first holder 19 and the second holder 20, and moves the first table 21 such that the reference marks are aligned between the first holder 19 and the second holder 20.

When aligning the reference marks, the arrangements of the small regions 18 of the wafers 16 and 17 are symmetric with respect to a planar surface between the wafers 16 and 17. Therefore, as a result of aligning the reference marks, the wafers 16 and 17 have a suitable arrangement in which (i) each small region 18 of the wafer 16 faces a corresponding small region 18 of the wafer 17 and (ii) the electrodes of the circuit elements of the small regions 18 of the wafer 16 face corresponding electrodes of the circuit elements of the small regions 18 of the wafer 17.

When aligning the wafers 16 and 17, the alignment mechanism 12 moves the first table 21 such that the wafers 16 and 17 are brought near each other with a very small gap S therebetween.

After the wafers 16 and 17 are aligned, the wafers 16 and 17 are held in the aligned position by the holding operation of the substrate holder 14, described further below. A block 23 is formed by the substrate holder 14 and the wafers 16 and 17 held by the substrate holder 14.

Figure 5:
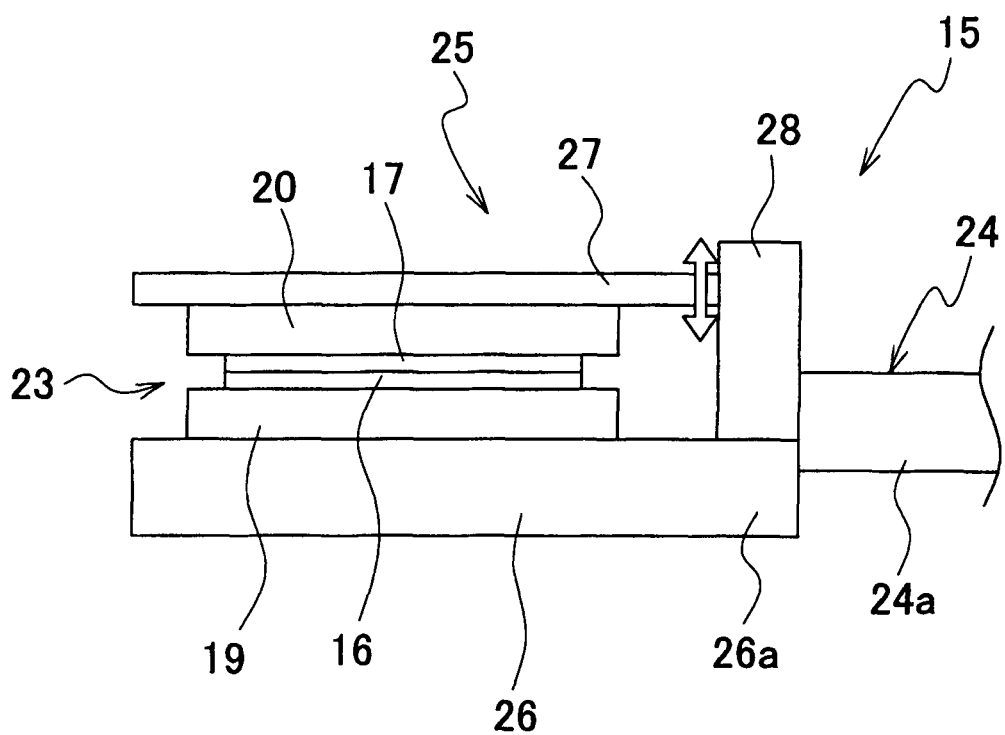
FIG. 5 is a schematic side-view of a gripping section 25 of the transport arm 24.

FIG. 5 is a schematic side-view of a gripping section 25 gripping the wafers 16 and 17 and the substrate holder 14. As shown in FIG. 1, the transport mechanism 15 includes a transport arm 24 and a gripping section 25 that is positioned on one end 24a of the transport arm 24 to grip the block 23.

As shown in FIG. 5, the gripping section 25 includes a support board 26 that extends from the one end 24a of the transport arm 24 to support the block 23 from below, and a pressing board 27 that presses the block 23 from above. The support board 26 is provided with an electrode, not shown. The block 23 is fixed by being adhered to the support board 26 using an electrostatic adhesion force caused by voltage applied to the electrode of the support board 26. The pressing board 27 can move in a vertical direction, as seen from the plane of FIG. 5, along a support column 28 provided on the base end 26a of the support board 26. The block 23 is fixed on the support board 26 and pressed by the force of the pressing board 27 to be sandwiched between the support board 26 and the pressing board 27.

The transport mechanism 15 transports the block 23 from the alignment mechanism 12 to the bonding mechanism 13 by moving the transport arm 24 with the block 23 being sandwiched between the support board 26 and the pressing board 27.

Figure 6:
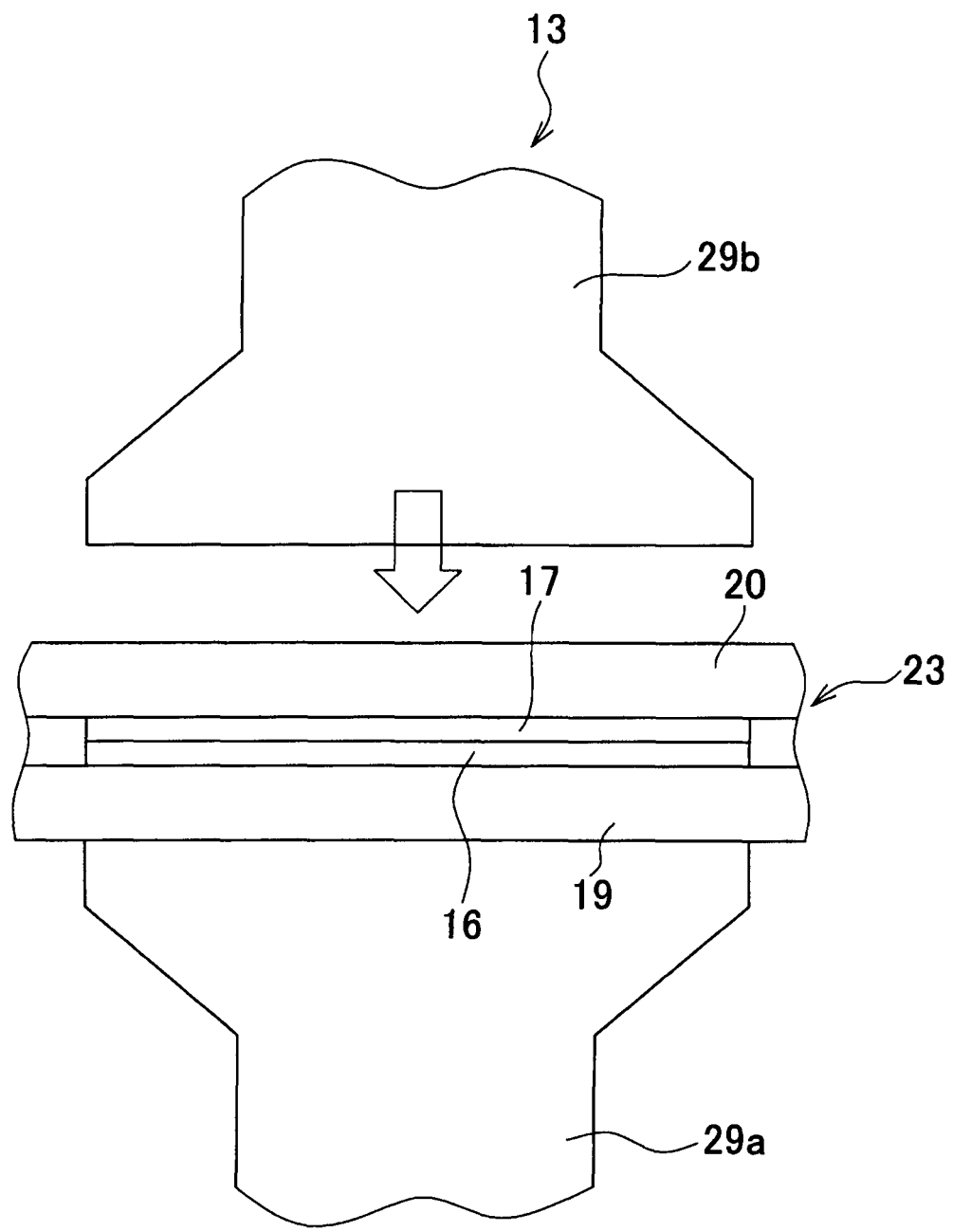
FIG. 6 is a schematic side-view of a state of the bonding mechanism 13.

FIG. 6 is a schematic side-view of a state of the bonding mechanism 13 when the wafers 16 and 17 and the substrate holder 14 are loaded therein. The bonding mechanism 13 includes a lower pressure-applying member 29a that is arranged below the first holder 19 and an upper pressure-applying member 29b that is arranged above the second holder 20. In the example of FIG. 6, the upper pressure-applying member 29b works together with the lower pressure-applying member 29a to apply pressure to the block 23 by moving the block 23 toward the lower pressure-applying member 29a.

The lower pressure-applying member 29a and the upper pressure-applying member 29b each contain a heater, not shown. By generating heat with the heater while pressure is applied to the block 23 between the lower pressure-applying member 29a and the upper pressure-applying member 29b as a result of the movement of the upper pressure-applying member 29b, the electrodes closely contacting the wafers 16 and 17 are welded together. In this way, the electrodes of the wafers 16 and 17 are bonded.

As shown in FIG. 3A, the first holder 19 is provided with a plurality of flat spring components 30. As shown in FIG. 3B, the second holder 20 includes joining members 31 that connect the flat spring components 30 in a prescribed position by exerting an adhesion force on the flat spring components 30.

Figure 7:
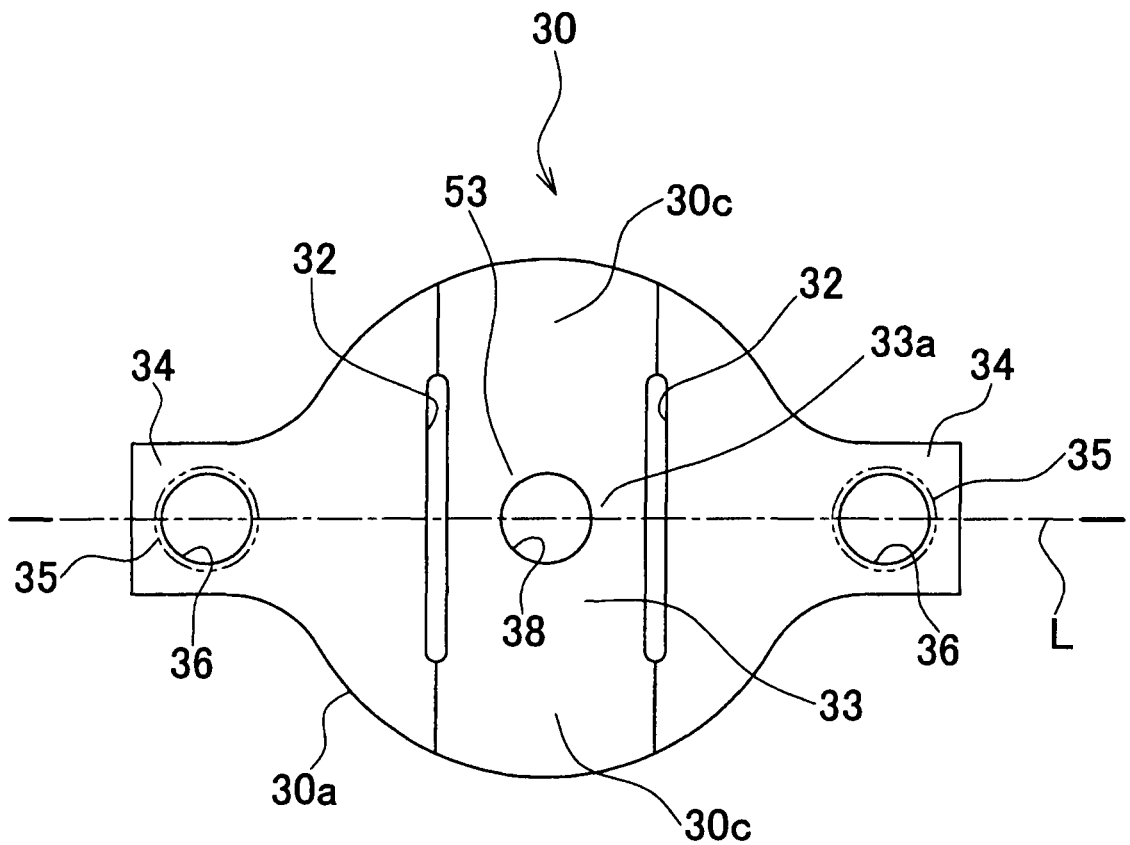
FIG. 7 is a schematic planar view of a flat spring component 30.

FIG. 7 is a schematic planar view of a flat spring component 30. In the example of FIG. 7, the flat spring component 30 is formed of high-strength precipitation hardening stainless steel (SUS631), and has a circular shape. In FIG. 7, the diameter of the flat spring component 30 is 22 mm, and the thickness is 0.1 mm.

Each flat spring component 30 includes a pair of slits 32 arranged extending in the same direction and to be separated from each other in a direction orthogonal to the extension direction. The slits 32 are formed at positions that are the same distance from the center of the flat spring component 30. By forming these slits 32 in each flat spring component 30, a band-shaped portion 33 that contains the center of the flat spring component 30 and that extends in a radial direction of the flat spring component 30 is formed between the slits 32. As shown in FIG. 3A, each flat spring component 30 is arranged on an edge 19b of the adhesion surface 19a of the first holder 19 such that the extension direction of the slits 32 is the same as the radial direction of the first holder 19.

In the example of FIG. 3A, six flat spring components 30 are arranged on the first holder 19, and each set of two flat spring components 30 forms one flat spring group 301. The flat springs 30 in each of the three flat spring groups 301 are separated by the same distance, and the distance between each flat spring component is the same in the circumferential direction of the first holder 19.

As shown in FIG. 7, each flat spring component 30 includes fixing portions 34 that are fixed on the first holder 19. In the example of FIG. 7, the fixing portions 34 are arranged at positions that are symmetric with respect to the position of the central portion 33a of the band-shaped portion 33, in a region outside of the region between the band-shaped portions 33 and the extension line of the slits 32, which is shown by the dotted line in FIG. 7.

In the example of FIG. 7, the fixing portions 34 expand outward in the radial direction of the flat spring component 30 along a direction orthogonal to the extension direction of the slits 32 from the border 30a of the flat spring component 30. An insertion hole 36 that allows for insertion of a screw component 35 therethrough is formed in each fixing portion 34. The flat spring component 30 is fixed to the first holder 19 via the screw components 35 by using the screw components 35 to fix the fixing portions 34 to the first holder 19.

Figure 8A:
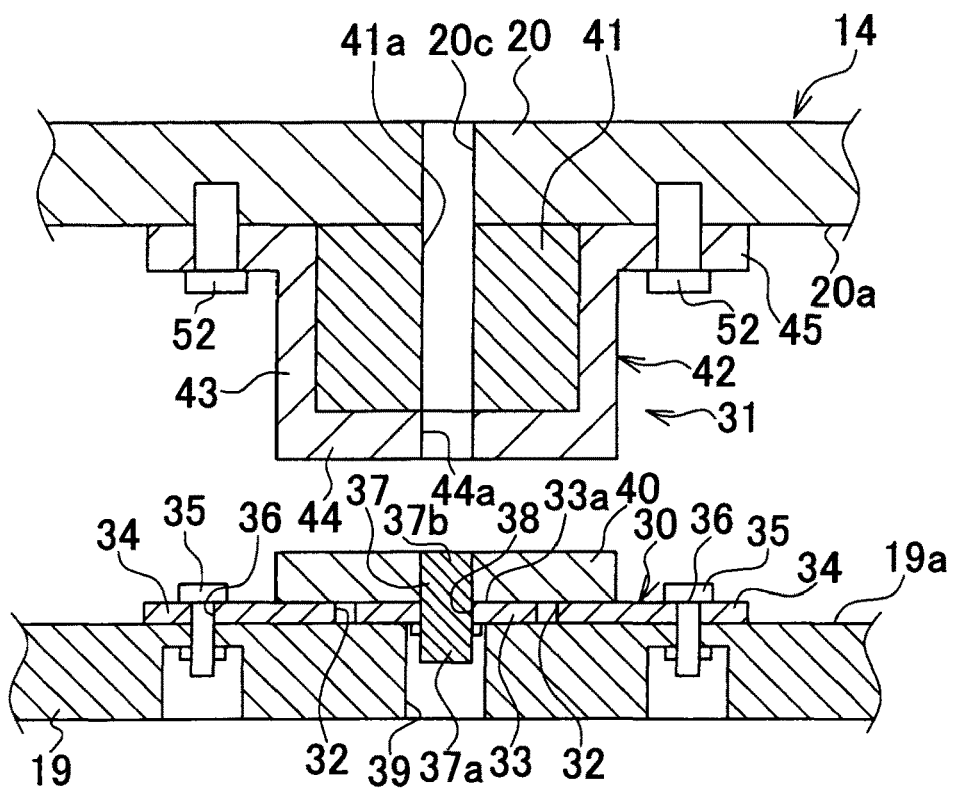
FIGS. 8A and 8B are magnified cross-sectional views of regions near the magnetic components 40 and magnets 41.
Figure 8B:
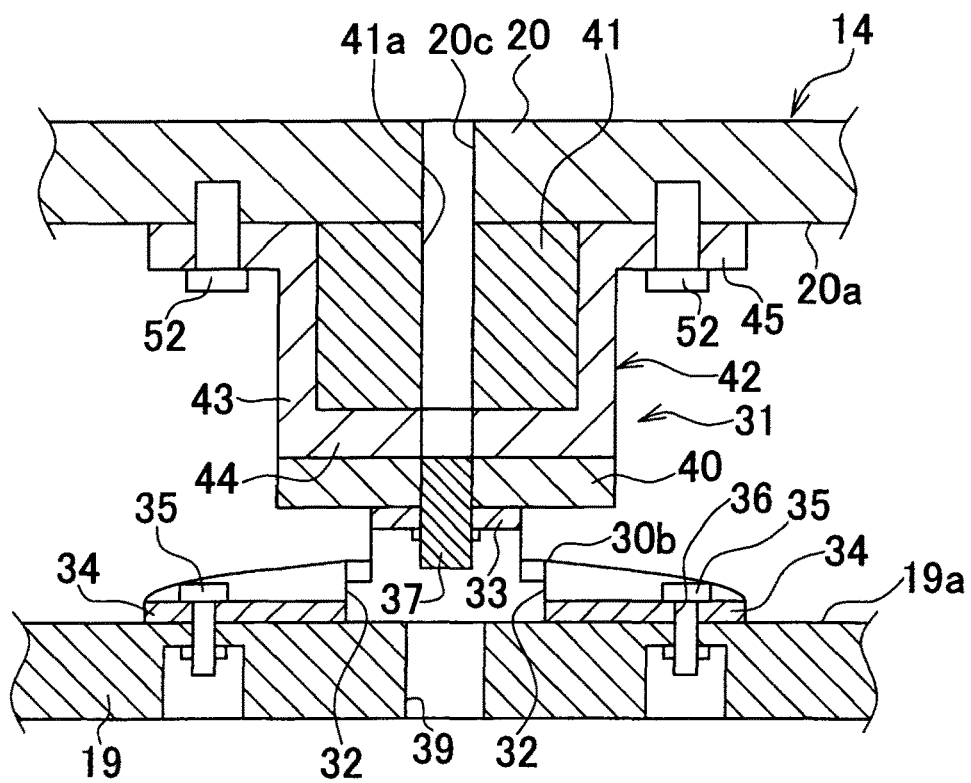

FIGS. 8A and 8B are magnified cross-sectional views of regions near the magnetic components 40 and the magnets 41. FIG. 8A is a schematic view of a state in which the joining member 31 and the flat spring component 30 are attached respectively to the first holder 19 and the second holder 20, and FIG. 8B is a schematic view of a state in which the magnetic component 40 is adhered to the joining member 31.

As shown in FIG. 8A, an insertion hole 38 through which a fixing member 37 is inserted is formed in a central portion of the flat spring component 30, i.e. the central portion 33a of the band-shaped portion 33. The fixing member 37 can be a screw, for example. One end 37a of the fixing member 37 can be inserted with room to spare into the through-tube 39 formed in the first holder 19 to correspond to the insertion hole 38 of the flat spring component 30.

The other end 37b of the fixing member 37 protrudes from the adhesion surface 19a. The flat spring component 30 is fixed to the fixing member 37 by threading the fixing member 37b of the fixing member 37 inside the insertion hole 38. The magnetic component 40 arranged above the flat spring component 30 is attached to the other end 37b of the fixing member 37.

In the example of FIGS. 8A and 8B, the magnetic component 40 is shaped as a disc and the center thereof is fixed to the other end 37b of the fixing member 37. As a result, the magnetic component 40 is fixed integrally with the flat spring component 30 via the fixing member 37 with the center of the magnetic component 40 being positioned on the central portion 33a of the band-shaped portion 33.

As shown in FIG. 9, the joining member 31 includes a magnet 41 and a covering member 42 that houses the magnet. As shown in FIG. 3B, each joining member 31 is arranged on the edge 20b of the adhesion surface 20a of the second holder 20 with a corresponding flat spring component 30.

In the example of FIGS. 8A and 8B, the magnet 41 is made of a cylindrical permanent magnet and has a magnetic force of 8 [N]. An insertion hole 41a that allows a pin component 48, described further below, to be inserted therethrough is formed in the center of the magnet 41. As shown in FIG. 8B, an insertion hole 20c aligned with the insertion hole 41a is formed in the second holder 20.

FIG. 9 is a schematic perspective view of a joining member 31. As shown in FIG. 9, the covering member 42 includes a cylindrical housing component 43 that houses the magnet 41 and a pair of attaching portions 45 formed in the housing component. The magnet 41 is housed in the housing component 43 with the axis of the magnet 41 being along the axis of the housing component 43. The housing component 43 includes a circular end wall 44 at one end 43a thereof. An insertion hole 44a aligned with the insertion hole 41a of the magnet 41 is formed in the center of the end wall 44.

The attaching portions 45a protrude in opposite directions from the circumferential wall of the housing component 43. As shown in FIG. 8A, the attaching portions 45a are fixed to the second holder 20 by fasteners 52, such as screw components.

The position of each flat spring component 30 relative to the first holder 19 and the position of each magnet 41 relative to the second holder 20 are set such that the insertion hole 41a of each magnet 41 is arranged above the central portion 33a of the corresponding band-shaped portion 33 when the wafers 16 and 17 are aligned by the alignment mechanism 12 such that the reference marks of the first holder 19 and the second holder 20 are aligned with each other.

Accordingly, the first holder 19 and the second holder 20 contact each other as described above when the wafers 16 and 17 are properly aligned with each other, and so the magnetic force of each magnet 41 effects the magnetic component 40 of the corresponding flat spring component 30. Furthermore, each flat spring component 30 is affected by the corresponding magnetic component 40 to experience an attractive force that draws the central portion 33a of the band-shaped portion 33 toward the magnet 41 due to the magnetic force of the magnet 41.

Figure 10:
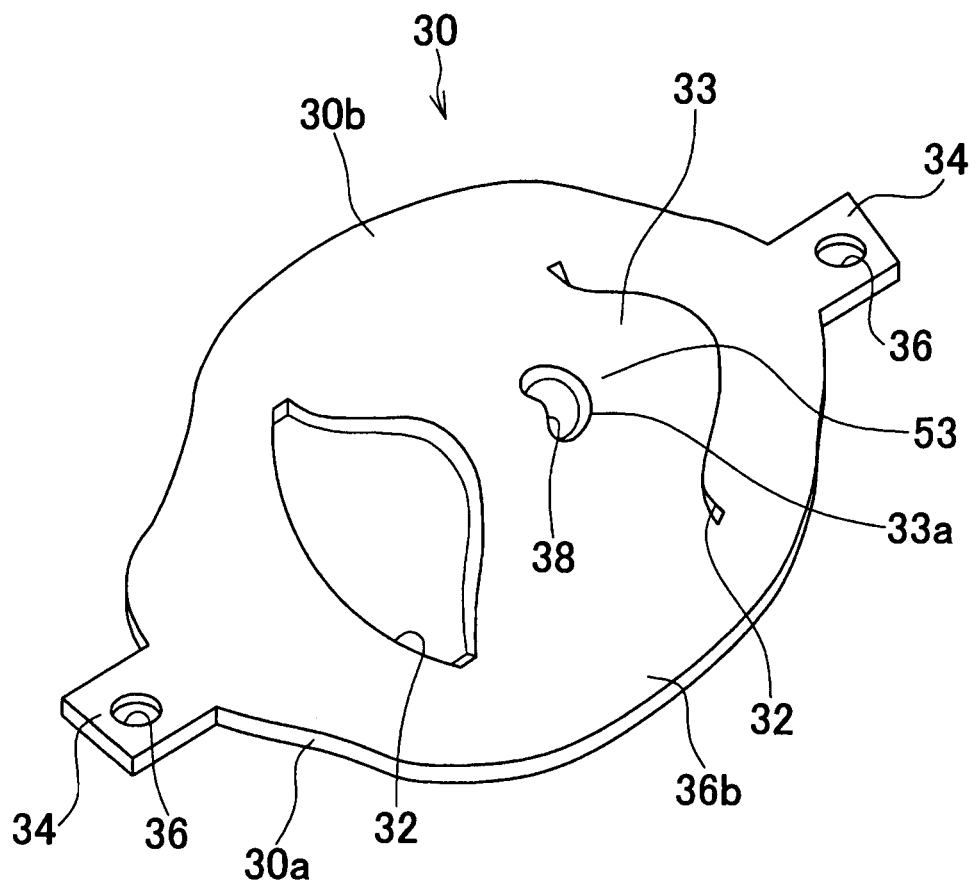
FIG. 10 is a schematic perspective view of a flat spring component 30 in a deformed state.

FIG. 10 is a schematic perspective view of a flat spring component 30 in a deformed state. Since the flat spring component 30 has a pair of slits 32, when the central portion 33a of the band-shaped portion 33 experiences an attractive force, the flat spring component 30 elastically deforms, with the line L (see FIG. 7) passing through both fixing portions 34 as a deformation reference line, such that the two portions 30b, which are opposite each other in the extension direction of the slits 32 on the border 30a of the flat spring component 30, draw closer to each other, and at the same time, the band-shaped portion 33 elastically deforms such that the central portion 33a rises up.

At this time, since the fixing member 37 is inserted with room to spare into a through-tube 39 of the first holder 19 as described above, the elastic deformation of the band-shaped portion 33 is not impeded by the fixing member 37. This elastic deformation of the band-shaped portion 33 allows the magnetic component 40 to move toward the joining member 31. The magnetic component 40 moves toward the joining member 31 to be adhered to the magnet 41 of the joining member via the end wall 44 of the covering member 42, and so the central portion 33a of the band-shaped portion 33 is joined to the joining member 31 via the magnetic component 40. In other words, the central portion 33a of the band-shaped portion 33 forms a connecting portion 53 that is joined to the joining member 31 with a prescribed positional relationship.

In this example, the prescribed positional relationship between the joining member 31 and the flat spring component 30 is such that, when the flat spring component 30 is joined to the joining member 31, a gap is formed therebetween that corresponds to the thickness of the magnetic component 40.

In the present embodiment, the alignment mechanism 12 includes a joining restricting unit 45 for controlling the joining of the joining member 31 to the flat spring component 30 when aligning the wafers 16 and 17, as shown in FIGS. 4A and 4B. In this example, the joining restricting unit 45 is formed of a plurality of push pins 46 passing through the second table 22.

Figure 11:
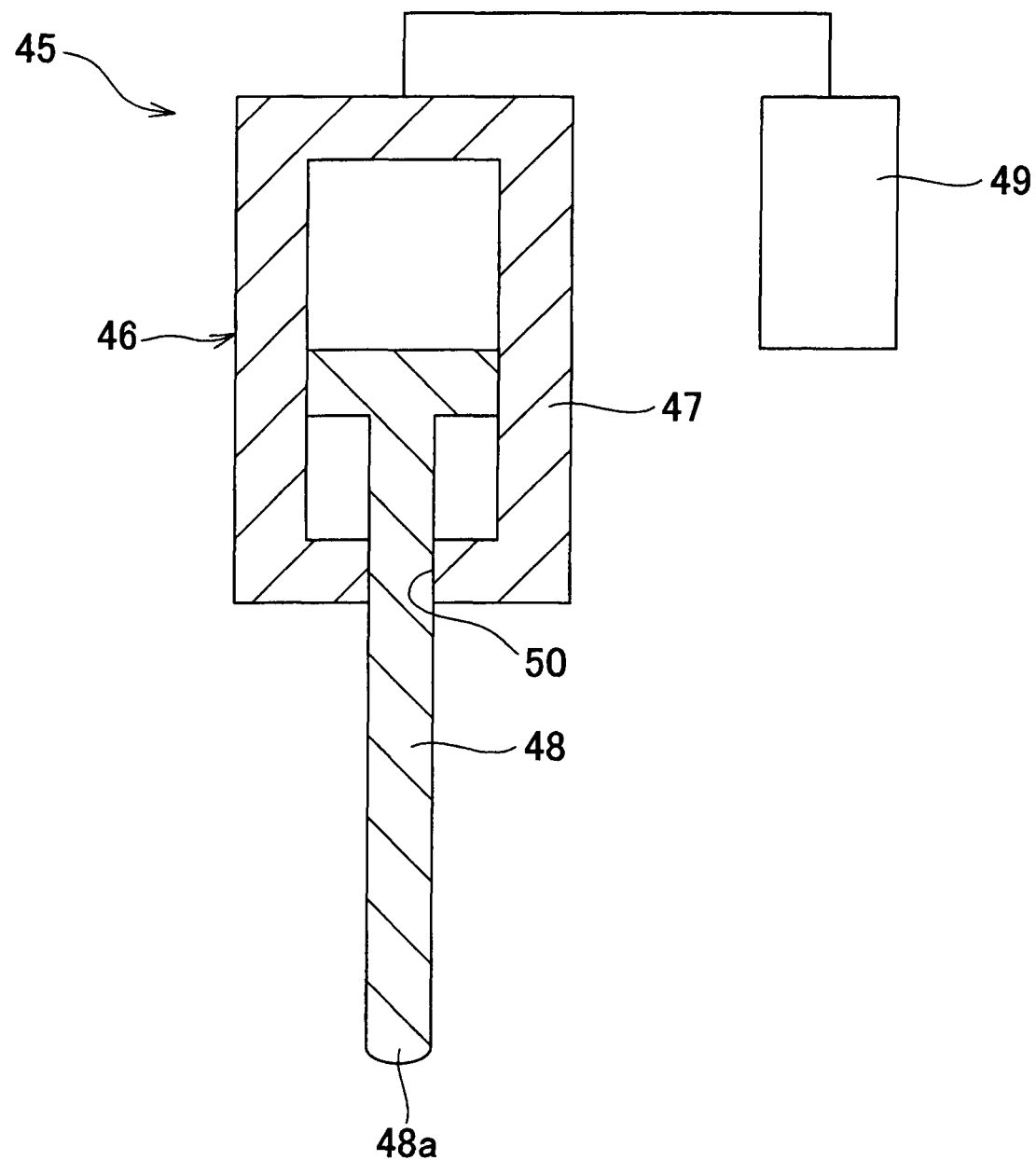
FIG. 11 is a schematic cross-sectional view of a push pin 46.

FIG. 11 is a schematic cross-sectional view of a push pin 46. Each push pin 46 is arranged to correspond to a joining member 31 of the second holder 20 while the second holder 20 is supported by the second table 22. As shown in FIG. 11, each push pin 46 includes a housing 47 that is fixed to the second table 22 and a pin component 48, described above, that can protrude from inside the housing toward the second holder 20. In addition, each push pin 46 has a biasing member that biases the pin component 48 from inside the housing 47 toward the second holder 20.

As shown in FIGS. 4A and 4B, the push pins 46 are suspended from the top plate 112. The pin components 48 pass through the magnet 41 and the second table 22 to contact the members to be joined 31. With this configuration, when the wafers 16 and 17 are bonded while the pin components 48 press on the magnet 41, the detection value of the load cell 150 is not affected by the magnetic force of the magnet 41.

The housing 47 has an aperture 50 that allows the pin component 48 to be inserted therethrough, and the aperture 50 is arranged to open toward the second holder 20. In the example of FIG. 11, the pin component 48 is made of a composite resin material with a low friction coefficient, such as a fluororesin. This fluororesin may include Teflon (registered trademark), for example.

In the example of FIG. 11, the biasing member is formed of an air pump 49 that adjusts the pressure in the housing 47. When the air pump 49 causes the pressure in the housing 47 to increase, the pin component 48 is pressed outward through the aperture 50 from inside the housing 47. The amount of pressure experienced by the pin component 48 is greater than the amount of attractive force exerted by the magnet 41 on the flat spring component 30.

When the alignment mechanism 12 aligns the wafers 16 and 17, the pin component 48 is pressed out from inside the housing 47, as shown in FIG. 4A, to pass through the second holder 20 supported on the second table 22 and the insertion holes 20c, 41a, and 44a of the magnet 41 and the covering member 42, and protrude from the end wall 44 of the covering member 42. The amount by which the pin component 48 protrudes from the end wall 44 is set to be approximately equal to the gap S to be provided between the wafers 16 and 17 during alignment. The control operation of the joining restricting unit 45 is described further below.

The following describes a method for bonding the wafers 16 and 17 using the substrate holder 14 described above.

When bonding the wafers 16 and 17 to each other, first, a substrate support process is performed. In the substrate support process, voltage is applied to the electrodes of the first holder 19 and the second holder 20 to adhere the wafers 16 and 17 respectively to the first holder 19 and the second holder 20, thereby supporting the wafers 16 and 17.

Next, an alignment process is performed, which involves using the alignment mechanism 12 to align the wafers 16 and 17.

When aligning the wafers 16 and 17, first, the first holder 19 and the second holder 20 are supported by the first table 21 and the second table 22, and pin component 48 of each push pin 46 is caused to protrude from the end wall 44 of the covering member 42 of the joining member 31.

Next, the first holder 19 and the second holder 20 are brought near each other by moving the first table 21 vertically toward the second table 22, such that the tip 48a of each pin component 48 contacts the corresponding magnetic component 40, as shown in FIG. 4A.

Furthermore, by moving the first table 21 toward the second table 22, the pressing force that presses each flat spring component 30 toward the first holder 19 is exerted on the flat spring components 30 via the magnetic components 40. At this time, the pressure exerted on each pin component 48 is greater than the attractive force exerted on the flat spring component 30 by the magnet 41, as described above, and so each flat spring component 30 resists the attractive force to press against the first holder 19. As a result, each flat spring component 30 is held in a no-load state without elastic deformation, and so joining between the magnetic components 40 and the joining members 31 is restricted. Furthermore, as described above, the amount that the pin component 48 protrudes from the end wall 44 is set to be approximately equal to the size of the gap S to be provided between the wafers 16 and 17, and so the circuit elements of the wafers 16 and 17 are prevented from contacting each other while the flat spring components 30 are pressed against the first holder 19.

Next, while the tip 48a of each pin component 48 contacts the corresponding magnetic component 40, the first table 21 moves horizontally to achieve appropriate alignment of the wafers 16 and 17.

Since the pin components 48 are formed of a composite resin material with a low friction coefficient such as fluororesin, as described above, when the movement of the first table 21 causes the tips 48a of the pin components 48 to slide on the magnetic components 40, a large amount of friction does not occur between the tips 48a of the pin components 48 and the magnetic components 40. Therefore, the effect of the friction between each pin component 48 and the corresponding magnetic component 40 on the alignment of the wafers 16 and 17 is minimized, and the pin components 48 slide smoothly on the magnetic components 40.

Since the wafer alignment is performed with the wafers 16 and 17 being near each other but without the electrodes of the circuit elements contacting each other, misalignment between that wafers 16 and 17 that may occur when the wafers 16 and 17 are brought near each other after alignment is prevented, and damage to the electrodes of the circuit elements of the wafers 16 and 17 that may occur when the wafers 16 and 17 are aligned while the circuit elements are in contact with each other can also be prevented.

After the alignment of the wafers 16 and 17 is completed, a holding process is performed that involves holding the wafers 16 and 17 in the aligned state.

In this holding process, first, the electrodes corresponding to the circuit elements of the wafers 16 and 17 are brought into contact with each other by moving the first table 21 further toward the second table 22 to bring the first holder 19 and the second holder 20 closer to each other.

Next, the pressing force exerted on the flat spring components 30 by the pin components 48 is removed by using the air pumps 49 of the push pins 46 to lower the pressure in the housings 47. As a result, the flat spring components 30 are elastically deformed by the attractive force, which causes the magnetic components 40 to be adhered and joined to the joining members 31 in the manner described above.

With the magnetic components 40 and the joining members 31 in a joined state, the majority of the reactive elastic force of the flat spring components 30 is transmitted from the flat spring components 30 to the first holder 19 and the second holder 20 via the magnetic components 40 as a force for bringing the holders closer to each other, and is then transmitted from the first holder 19 and the second holder 20 to the wafers 16 and 17 as a force that sandwiches the wafers 16 and 17 in a direction of the board thickness.

As a result, the wafers 16 and 17 are held in the aligned state by being sandwiched between the first holder 19 and the second holder 20.

Furthermore, since the flat spring components 30 are circular and each pair of fixing portions 34 are positioned symmetrically with respect to the center of the corresponding flat spring component 30, i.e. with respect to the central portion 33a of the corresponding band-shaped portion 33, the areas of the two portions separated by the line of each flat spring component 30 are equal to each other. As a result, when these two portions of each flat spring component 30 are elastically deformed to join the magnetic components 40 with the joining members 31, the force exerted on each deformation portion is equal. In other words, when the deformation portions are elastically deformed by the adhesion force, i.e. magnetic force, from the joining members 31, the reactive elastic force in each deformation portion is the same.

Since each set of fixing portions 34 are positioned symmetrically with respect to the center of the corresponding flat spring component 30, when the deformation portions are deformed, components of the reactive elastic force, which is transmitted from the deformation portions to the second holder 20 via the joining members 31, that are in directions orthogonal to the direction of the board thickness of the first holder 19 and the second holder 20. i.e. components of the elastic reactive force in directions that would skew the symmetrical positions of the first holder 19 and the second holder 20, are oriented in directions opposite each other.

Accordingly, when the deformation portions are elastically deformed by the attractive force received from the joining members 31 via the magnetic components 40, the components of the reactive elastic force caused by deformation regions that are in directions that would skew the symmetric positions of the first holder 19 and the second holder 20 cancel each other out. As a result, the reactive elastic force of the flat spring components 30 does not act on the second holder 20 in a manner to skew the symmetric positioning of the first holder 19 and the second holder 20.

When the magnetic components 40 are adhered to the joining members 31, e.g. when the magnetic components 40 directly contact the magnets 41, the magnets 41 might be damaged by the impact of the adhesion, but in the present embodiment, the magnets 41 are housed in the covering members 42. Therefore, the magnetic components 40 contact the end walls 44 of the covering members 42 without contacting the magnets 41, and so damage caused by the impact with the magnets 41 during adhesion is prevented.

Furthermore, when adhering the joining members 31 to the magnetic components 40, the amount that each magnetic component 40 moves can be caused to correspond with the thickness of the wafers 16 and 17 being held by changing the deformation amount of the corresponding flat spring component 30 toward the corresponding joining member 31. As a result, the wafers 16 and 17 can be held reliably regardless of the thickness of the wafers.

The magnetic components 40 can be adhered to the magnets 41 easily by deforming the flat spring components 30 toward the joining members 31, and so it is not necessary to increase the magnetic force of the magnets 41 when holding thicker wafers. Therefore, the wafers are not held with a large sandwiching force, thereby preventing damage to the circuit elements due to the sandwiching force.

In comparison, when a non-deforming component other than the flat spring component 30 is simply drawn toward the magnet 41, it is necessary for the magnet 41 to have a stronger magnetic force when there is a larger gap between the first holder 19 and the second holder 20, which is necessary when holding thicker wafers. However, such a strong magnetic force creates a strong force that acts to bring the first holder 19 and the second holder 20 toward each other, and so the first holder 19 and the second holder 20 exert a strong sandwiching force on the wafers held therebetween. This large sandwiching force may damage the circuit elements of the wafers.

After the magnetic components 40 are joined to the joining members 31, the first table 21 is moved away from the second table 22 so that that block 23 formed of the substrate holder 14 and the wafers 16 and 17 can be removed from between the first table 21 and the second table 22.

At this time, the supporting force supplied from the first table 21 and the second table 22 to the first holder 19 and the second holder 20 is removed. As described above, the reactive elastic force of the flat spring components 30 does not skew the symmetric positions of the first holder 19 and the second holder 20, and so when the supporting force is removed, the proper symmetric positioning of the wafers 16 and 17 is not skewed.

After the wafers 16 and 17 are held in the aligned state by the joining of the joining members 31 and the magnetic components 40, a transport process is performed to transport the block 23.

In the transport process, the block 23 is grasped by the gripping section 25 of the transport mechanism 15 in the manner described above, and is transported by the transport arm 24 from the alignment mechanism 12 to the bonding mechanism 13.

When the transport arm 24 starts or stops moving, the block 23 experiences an inertial force. At this time, if there is a difference between the amount of inertial force experienced by the first holder 19 and the amount experienced by the second holder 20, the flat spring components 30 joined integrally with the joining members 31 by the magnetic force experience a force in a direction orthogonal to the board thickness of the first holder 19 and the second holder 20.

Both longitudinal ends of the band-shaped portion 33 of each flat spring component 30 are connected to a region outside the band-shaped portion 33, and so when there is a force along the longitudinal direction of the band-shaped portion 33, the majority of this force is absorbed as a compression force that compresses the band-shaped portion 33 and this region.

On the other had, a pair of slits 32 are formed in each flat spring component 30, and so the edges of the band-shaped portion 33 facing each other across the width thereof are not connected to this region of the flat spring component 30. Therefore, when there is a force along the width of the band-shaped portion 33, the majority of this force is not absorbed by this region of the flat spring component 30, but instead causes elastic deformation that increases the width of one of the slits 32 and decreases the width of the other slit 32. Accordingly, the band-shaped portions 33 can be more easily deformed when a force in the direction of the width is applied than when a force in the longitudinal direction is applied.

In the present embodiment, the flat spring components 30 are arranged such that the extension direction of the slits 32 is the radial direction of the first holder 19, as described above. Therefore, when there is a difference in the amount of inertial force experienced by the first holder 19 and by the second holder 20, even if the direction of the force experienced by one of the plurality of flat spring components 30 is in the direction of the width of the band-shaped portion 33 of the flat spring component 30, the majority of the force experienced by the band-shaped portions 33 of the other flat spring components 30 is in a direction other than the direction of the width.

As a result, this force is received and absorbed by the other flat spring components 30, and so misalignment between the first holder 19 and the second holder 20 due to the deformation of the flat spring components 30 is prevented. Accordingly, the block 23 can be transported without misalignment occurring between the wafers 16 and 17, regardless of the direction of the inertial force experienced by the block 23 when the transport arm 24 starts or stops moving.

In comparison, if the flat spring components 30 are arranged such that the slits 32 all extend in a single direction, there is a concern that the band-shaped portions 33 will deform in a direction orthogonal to the direction of the board thickness of the first holder 19 and the second holder 20 when a force in the direction of the width of the band-shaped portions 33 is experienced by the flat spring components 30 due to a difference in the amount of inertial force experienced by the first holder 19 and by the second holder 20. When the band-shaped portions 33 deform in this way, the first holder 19 and the second holder 20 deviate from their proper relative positions, and this causes the wafers 16 and 17 to also deviate from their proper relative positions.

In the transporting process, the block 23 is transported while voltage is applied to the electrodes of the first holder 19 and the second holder 20.

After the transporting process, a bonding process is performed to bond the transported wafers 16 and 17 to each other.

In the bonding process, the bonding mechanism 13 is used to weld the electrodes of the wafers 16 and 17 as described above. As a result, the wafers 16 and 17 are bonded to each other.

When manufacturing a multi-layered semiconductor apparatus using the substrate holder 14 described above, first, a substrate forming process is performed. In the substrate forming process, the wafers 16 and 17 to be bonded are formed by dividing one surface of the thin base component B shown in FIG. 2 into a plurality of small regions 18 and forming a plurality of circuit elements in each of these small regions.

Next, after the substrate supporting process, the alignment process, the holding process, and the bonding process, a separation process is performed.

FIG. 12 is a schematic perspective view of the multi-layered semiconductor apparatus 51. In the separation process, the bonded wafers 16 and 17 are cut along the dotted lines of FIG. 2 using a specialized cutter, not shown, to separate the plurality of small regions 18. As a result, a multi-layered semiconductor apparatus 51 such as that shown in FIG. 12 is formed, and this multi-layered semiconductor apparatus 51 is a layered structure including two layered chips 54.

After this, the multi-layered semiconductor apparatus 51 is packaged by performing a mounting process that involves mounting the multi-layered semiconductor apparatus 51 on a lead frame and a connecting process that involves connecting the multi-layered semiconductor apparatus 51 to the lead.

The present embodiment can reliably prevent misalignment between the first holder 19 and the second holder 20 due to force transmitted from the flat spring components 30 to the second holder 20, as described above. Therefore, the present embodiment can reliably control the relative positions of the wafers 16 and 17 held by the first holder 19 and the second holder 20 such that misalignment between the electrodes of the circuit elements of the wafer 16 and the corresponding electrodes of the circuit elements of the wafer 17 is prevented. Accordingly, the present embodiment can reliably prevent electrical contact defects from occurring between the wafers 16 and 17 when the wafers 16 and 17 are bonded to each other.

Since each joining member 31 includes a magnet 41 and each flat spring component 30 is provided with a magnetic component 40, as described above, the flat spring components 30 and the joining members 31 can be joined easily by adhering the magnetic components to the magnets 41.

As described above, the three flat spring groups 301 are arranged on the edge 19b of the adhesion surface 19a of the first holder 19 such that the interval between the flat spring components 30 in each flat spring group 301 is equal and the intervals between the flat spring groups are the same in the circumferential direction of the first holder 19. Therefore, with the flat spring components and the joining members in the joined state, the sandwiching force in the direction of the plate thickness exerted on the wafers 16 and 17 by the flat spring components 30 is applied substantially evenly in the circumferential direction of the first holder 19 and the second holder 20.

As described above, by fixing each flat spring component 30 to the first holder 19 via the pair of fixing portions 34 formed at positions opposite each other on the border 30a of the flat spring component 30, when a flat spring component 30 is elastically deformed with the line L passing through both of the fixing portions 34 as a deformation reference line such that two regions opposite each other draw near each other in the extension direction of the slits 32, the central portion 33a of the corresponding band-shaped portion 33 is simultaneously elastically deformed to rise up. Therefore, when the deformation amount of the flat spring component 30 changes, the path of the central portion 33a of the band-shaped portion 33 becomes a straight line that extends in the direction of the board thickness of the first holder 19 and the second holder 20. As a result, even when a large amount of deformation of the flat spring components 30 is required, this deformation of the flat spring components 30 does not cause an increase or decrease in the contact area between the flat spring components 30 and the end walls 44 of the covering members 42 of the joining members 31. Accordingly, it is possible to reliably prevent a decrease in the holding force between the first holder 19 and the second holder 20 due to a decrease in the contact area between the flat spring components 30 and the joining members 31.

In comparison, when the flat spring components 30 are in a cantilevered state, as in conventional configurations, each flat spring component 30 is deformed with one end thereof as a base and the other end, on which the magnet is provided, rotating around the one end, and so the path traveled by the other end of the flat spring component 30 during deformation is an arc. Therefore, when it is necessary to increase the deformation amount of the flat spring components 30 because the space between the holders increases due to an increase in the thickness of the substrate sandwiched by the holders, for example, the angle of rotation of each flat spring component 30 having one end as a base increases. When the angle of rotation increases, the adhesion surface of one of the magnets becomes slanted relative to the adhesion surface of the other magnet, and so these magnets experience so-called "shoulder touching." When a gap occurs between the magnets due to this shoulder touching phenomenon, the magnetic force that each magnet receives from the other becomes less than in a case where the adhesion surfaces of the magnets are in complete surface contact with each other. As a result, the holding force that the magnets cause between the holders decreases.

FIGS. 13A and 13B are planar views of other flat spring components 30. FIGS. 13A and 13B are schematic views of other embodiments. In the embodiment described above, each fixing portion 34 expands radially outward from the border 30a of the flat spring component 30 along a direction that is orthogonal to the extension direction of the slits 32.

Instead, as shown in FIG. 13A, the two fixing portions 34 can be formed at positions opposite each other in the flat spring component 30 in a direction orthogonal to the extension direction of the slits 32. In this case, the positions of the fixing portions 34 are symmetric with respect to the central portion 33a of the band-shaped portion 33, which is the connecting portion 53. In the example of FIG. 13A, an insertion hole 36 is formed in each fixing portion 34 that allows a screw component 35 to be inserted therethrough.

In the example of FIG. 13A, when an attractive force is experienced from the magnet 41 via the magnetic component 40 such that the flat spring component 30 is elastically deformed with the line L passing through both of the fixing portions 34 as a deformation reference line such that two regions 30b, which are opposite each other in the extension direction of the slits 32, draw near each other, the central portion 33a of the corresponding band-shaped portion 33 is simultaneously elastically deformed to rise up, in the same manner as described above.

Instead of the example shown in FIG. 13A, although not shown, the fixing portions 34 can be arranged to be symmetric relative to the central portion 33a of the band-shaped portion 33 at positions other than the regions 30b and the regions 30c between the band-shaped portion 33 and the extension lines of the slits 32.

In the embodiment described above, each flat spring component 30 has two fixing portions 34, but instead, each flat spring component 30 can include only one fixing portion 34.

In the example of FIG. 13B, the fixing portion 34 includes two regions 30c between the band-shaped portion 33 and extension lines of the two slits 32, and this fixing portion 34 extends in the radial direction of the flat spring component 30. In the example of FIG. 13B, insertion holes 36 that allow screw components 35 to be inserted therethrough are formed at the ends of the fixing portion 34, i.e. in the regions 30c between the extension lines.

In this case, upon receiving the attractive force from the magnet 41, the flat spring component 30 elastically deforms with the line L2 passing through both of the insertion holes 36 as a deformation reference line such that two regions 30d that are on opposite sides of a line orthogonal to the extension direction of the slits 32 on the border 30a, i.e. the regions 30d that are linearly symmetric on the line L2, draw near each other. In other words, the regions 30d of the flat spring component 30 act as the connecting portion 53 described above for joining with the joining members 31. Accordingly, in the embodiment of FIG. 13B, the magnetic components 40 are mounted on the regions 30d.

In the embodiment described above, the pair of slits 32 are formed in each flat spring component 30, but these slits can be omitted. FIGS. 14A and 14B are planar views of other flat spring components 30. FIGS. 14A and 14B are schematic views of other embodiments.

When there are no slits, as shown in FIG. 14A, the fixing portion 34 is arranged in the center of the flat spring component 30 and the connecting portions 53 are arranged symmetrically with respect to the position of the fixing portion 34. The insertion hole 36 that allows the screw component 35 to be inserted therethrough is formed in the fixing portion 34. In this case, the fixing member 37 can be omitted.

Instead of the example shown in FIG. 14A, the fixing portion 34 can be set to be a region that includes the center of the flat spring component 30 and extends in the radial direction of the flat spring component 30, and the insertion holes 36 can be formed in a pair of regions opposite each other along the border 30a of the flat spring component 30 at the ends of the fixing portion, as shown in FIG. 14B. In this case, the fixing member 37 can be omitted.

In the example of FIG. 14B, upon receiving the attractive force from the magnet 41, the flat spring component 30 elastically deforms with the line L3 passing through both of the insertion holes 36 and the center of the flat spring component 30 as a deformation reference line such that two peak portions 30e, which are the peaks of two semicircles formed by the line L3, i.e. peaks that are symmetrical with respect to the line L3, draw near each other. In other words, the peak portions 30e of the flat spring component 30 act as the connecting portion 53. Accordingly, the magnetic components 40 are mounted on the peak portions 30e.

In the examples described in FIGS. 1 to 14B, the flat spring components 30 each have a circular shape, but rectangular flat spring components may be used instead.

Furthermore, in the examples described in FIGS. 1 to 14B, the flat spring components 30 are made from SUS631, but instead, a flat spring component can be used in which at least the connecting portion 53 is magnetic. In this case, the connecting portion 53 can be formed of a magnetic material, or the connecting portion 53 can be formed of a non-magnetic material and magnetic bodies can be mixed into this material.

When the connecting portion 53 is magnetic, the magnetic component 40 can be omitted. Furthermore, in this case, each connecting portion 53 is joined to the corresponding magnet by being directly adhered thereto by the attractive force of the magnet 41.

In this case, instead of only the connecting portions 53 being magnetic, the flat spring components 30 themselves can also be formed of magnetic material, or formed of a non-magnetic material into which magnetic bodies are then added.

In this example, the prescribed positional relationship between each flat spring component 30 and the corresponding joining member 31 is such that the flat spring component 30 and the joining member 31 directly contact each other during joining.

In the examples of FIGS. 1 to 14B, the magnet 41 of the joining members 31 are formed by permanent magnets, but instead, the magnets 41 may be electromagnets.

In the examples of FIGS. 1 to 14B, the joining members 31 use the magnetic force of the magnets 41 to attract the flat spring components 30, but instead, joining members may be used that attract the flat spring components 30 using atmospheric pressure, e.g. vacuum adhesion.

In the examples of FIGS. 1 to 14B, the pin components 48 of the push pins 46 are formed of a composite resin material with a low friction coefficient, such as a fluororesin, but instead, a Teflon (Registered Trademark) coating can be applied to at least the peripheral surface of the tip 48a of each pin component 48.

In the examples of FIGS. 1 to 14B, the biasing members 49 that bias the pin components 48 from inside the housings 47 toward the second holder 20 are formed as air pumps 49 that adjust the pressure in the housings 47, but instead, the biasing members 49 can be formed as compression coil springs that have a larger spring force than the attractive force exerted on the flat spring components 30 by the magnets 41.

In the examples of FIGS. 1 to 14B, the joining restricting units 45 are formed by push pins 46, but instead, the joining restricting units 45 may be formed of spacer members arranged between the joining members 31 and the magnetic components 40.

In this case, the thickness of each spacer member is set to be approximately equal to the size of the gap S to be provided between the wafers 16 and 17 during alignment. Furthermore, in this case, the insertion holes 41a and 44a of the magnets 41 and the covering members 42 can be omitted.

In this example, each spacer is inserted between a joining member 31 and a magnetic component 40 when aligning the wafers 16 and 17, and is sandwiched therebetween. At this time, the pressing force from the joining members 31 acting on the flat spring components 30 works against the attractive force exerted on the flat spring components 30 by the magnets 41, thereby pressing the flat spring components 30 against the first holder 19. As a result, the flat spring components 30 are held with the prescribed intervals therebetween.

When aligning the wafers 16 and 17, the joining restricting unit 45 can be formed with components other than the push pin 46 and the spacer member as long as the joining of the joining members 31 and the flat spring components 30 can be controlled to be in the prescribed positional relationship.

In the examples of FIGS. 1 to 14B, each of the two substrates 11 bonded to each other is formed by one of the wafers 16 and 17, but instead, one of the substrates 11 may be formed by a single wafer and the other substrate 11 may be formed as a multi-layered structure by bonding a plurality of stacked wafers, or both substrates 11 may be formed as such multi-layered structures.

In the examples of FIGS. 1 to 14B, the first holder 19 and the second holder 20 are both formed as discs, but instead, one of the holders can be formed in a different shape, such as a rectangle. For example, if the first holder 19 is disc-shaped and the second holder 20 is rectangular, the joining members 31 can be arranged on the second holder 20 in positions corresponding to the positions of the flat spring components 30 arranged on the first holder 19.

Figure 15:
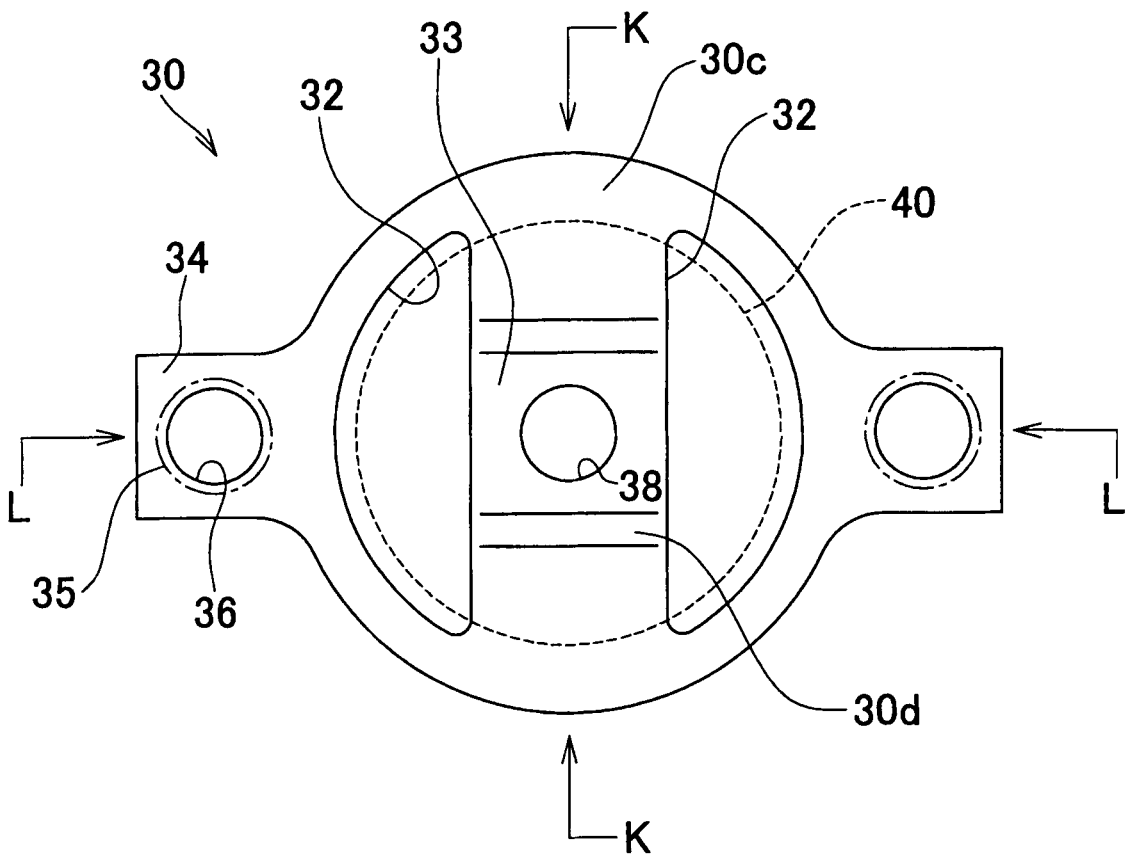
FIG. 15 is a planar view of another flat spring component 30.

FIG. 15 is a planar view of a flat spring component 30 according to another embodiment. Components that are the same as those of the flat spring component 30 shown in FIG. 7 are given the same reference numerals and redundant explanations are omitted.

This flat spring component 30 also includes a pair of slits 32. In order to avoid interfering with the magnetic component 40 when the flat spring component 30 deforms in the manner described below, one side of each slit 32 is formed as an arc. These arcs each have a radius that is slightly greater than the outer circumference of the magnetic component 40. Furthermore, the band-shaped portion 33 of the flat spring component 30 includes a pair of steps 30d sandwiching the insertion hole 38.

Figure 16:
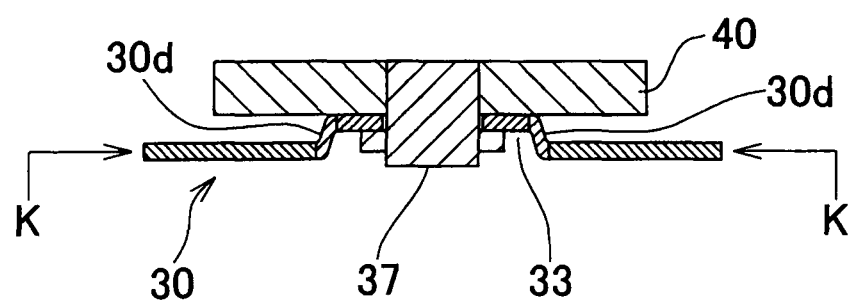
FIG. 16 is a cross-sectional view of the flat spring component 30 and the magnetic component 40.

FIG. 16 is a cross-sectional view of the flat spring component 30 shown in FIG. 15 when the magnetic component 40 is loaded thereon. This cross-sectional view is taken along the line K-K in FIG. 15. Components that are the same as those shown in FIG. 15 are given the same reference numerals.

As shown in FIG. 16, the steps 30d causes the central portion of the band-shaped portion 33 to be elevated from other portions of the flat spring component 30. As a result, the flat spring component 30 and the magnetic component 40 do not interfere with each other when the fixing portion 34 of the flat spring component 30 is deformed upward relative to the band-shaped portion 33.

Figure 17:
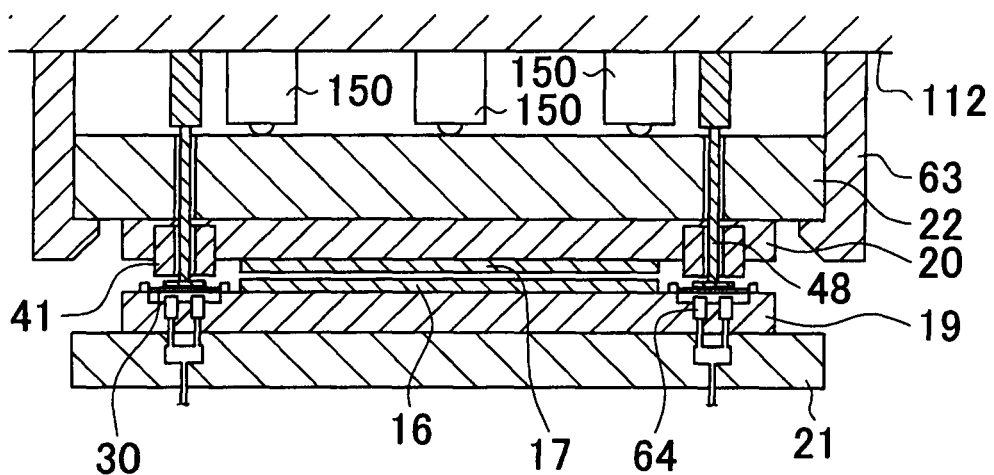
FIG. 17 is a cross-sectional view of the bonding mechanism 13 during one stage in the process for bonding the wafers 16 and 17.

FIG. 17 is a schematic cross-sectional view of a configuration of the alignment mechanism 12 that includes the flat spring component 30 described above. Components that are the same as those shown in FIG. 4A are given the same reference numerals and redundant explanations are omitted.

In addition to the configuration of the alignment mechanism 12 shown in FIG. 4A, this alignment mechanism 12 further includes a suction unit 64 that sucks the flat spring component 30 and the magnetic component 40 downward when the first holder 19 holding the wafer 16 is loaded on the table 21. The suction unit 64 is connected to a vacuum source, not shown, and creates negative pressure therein when active.

FIG. 17 shows the alignment mechanism 12 in a state where the wafers 16 and 17 are loaded thereon prior to bonding. The wafers 16 and 17 are held by the first holder 19 and the second holder 20, respectively, which are in turn supported by the tables 21 and 22. There is a gap between the wafers 16 and 17, and the bottom end of the pin component 48 contacts the top surface of the magnetic component 40 when lowered.

Figure 18:
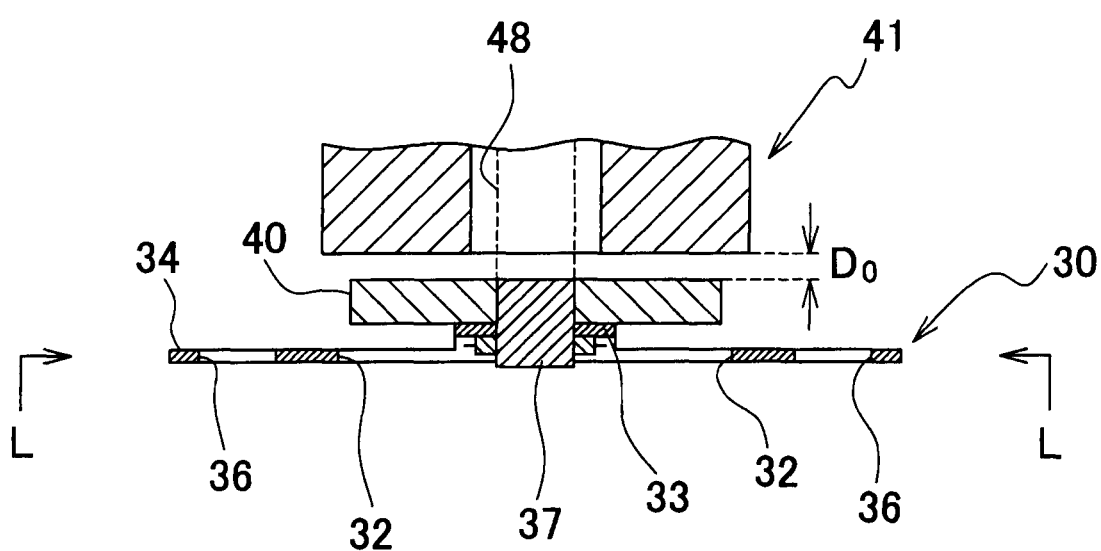
FIG. 18 is a cross-sectional view of the flat spring component 30 and the magnetic component 40.

FIG. 18 is a magnified cross-sectional view of the flat spring component 30 and the magnetic component 40 of the alignment mechanism 12 in the state shown in FIG. 17. The cross-sectional view of the flat spring component 30 is taken along the line L-L shown in FIG. 15. Components that are the same as those in FIG. 15 are given the same reference numerals.

As shown in FIG. 18, the bottom end of the pin component 48 contacts the magnetic component 40, and so the magnetic force of the magnet 41 does not adhere the magnetic component 40 to the magnet. Accordingly, a gap $D_0$ is formed between the magnet 41 and the magnetic component 40. Furthermore, the flat spring component 30 is barely deformed, and therefore flat.

Figure 19:
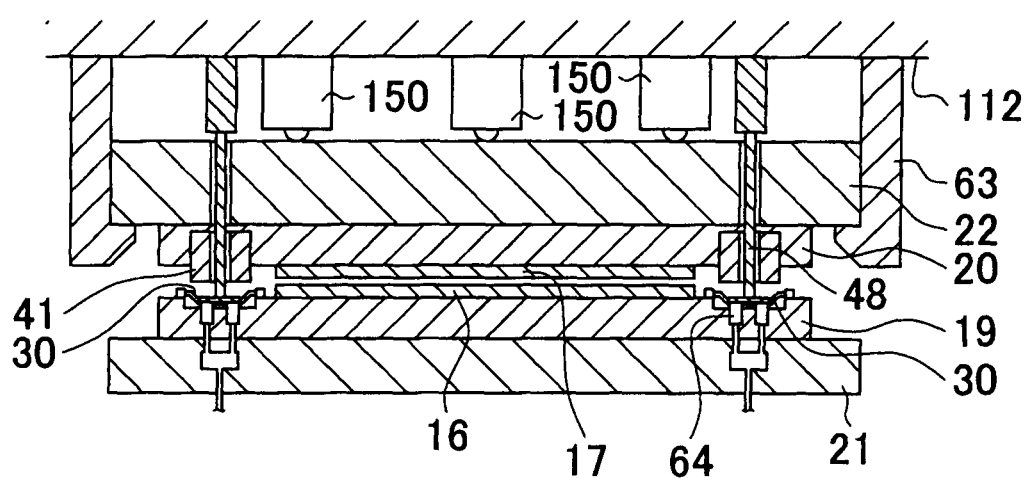
FIG. 19 is a cross-sectional view of the bonding mechanism 13 during the next stage in the process for bonding the wafers 16 and 17.

FIG. 19 is a cross-sectional view of the alignment mechanism 12 during the next stage in the process for bonding the wafers 16 and 17. Compared to the state shown in FIG. 18, the pin component 48 in FIG. 19 is lowered further to press down on the magnetic component 40.

Figure 20:
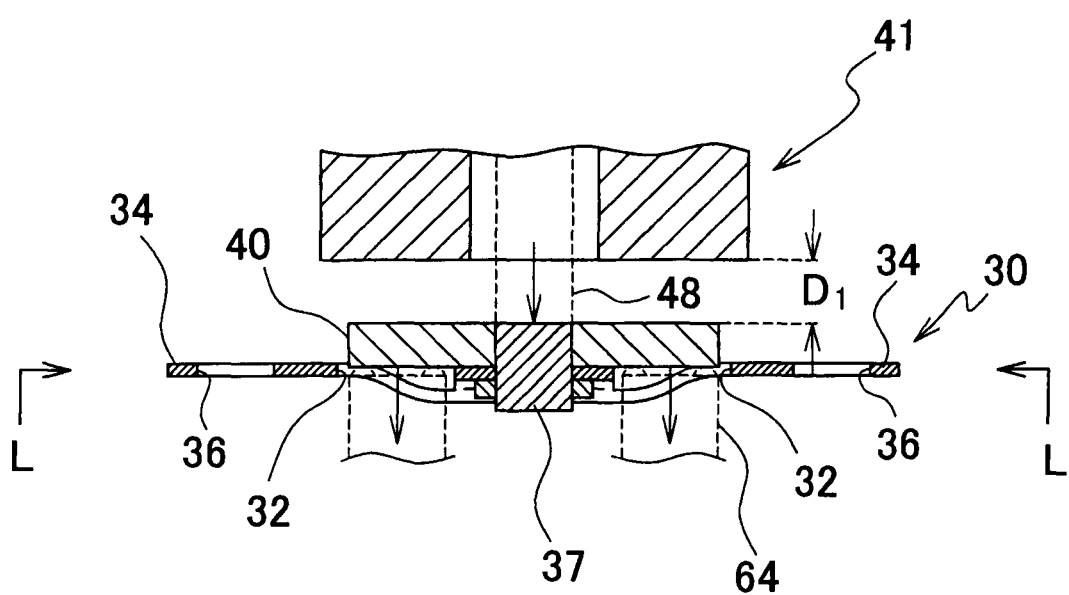
FIG. 20 is a cross-sectional view of the magnetic component 40 and the flat spring component 30 in the state shown in FIG. 19.

FIG. 20 is a magnified cross-sectional view of a region around the magnetic component 40 of the alignment mechanism 12 in the state shown in FIG. 19. As shown in FIG. 20, the magnetic component 40 that is pressed down by the pin component 48 contacts the top end of the suction unit 64, and is thereby adhered to the suction unit 64. As a result, the gap between the magnet 41 and the magnetic component 40 is enlarged, and so the magnetic force experienced by the magnetic component 40 is decreased.

The flat spring component 30 is deformed by the magnetic component 40 pressing down thereon, such that the bottom surface of the magnetic component 40 moves to a position lower than the top surface of the flat spring component 30. Accordingly, the gap between the magnet 41 and the magnetic component 40 widens to a distance $D_1$. However, due to the shape of the slits 32 shown in FIG. 15, the magnetic component 40 and the flat spring component 30 do not interfere with each other in the longitudinal direction of the flat spring component 30. Furthermore, as shown in FIG. 16, the band-shaped portion 33 of the flat spring component 30 is elevated, and so the magnetic component 40 and the flat spring component 30 do not interfere with each other in the extension direction of the band-shaped portion 33.

Figure 21:
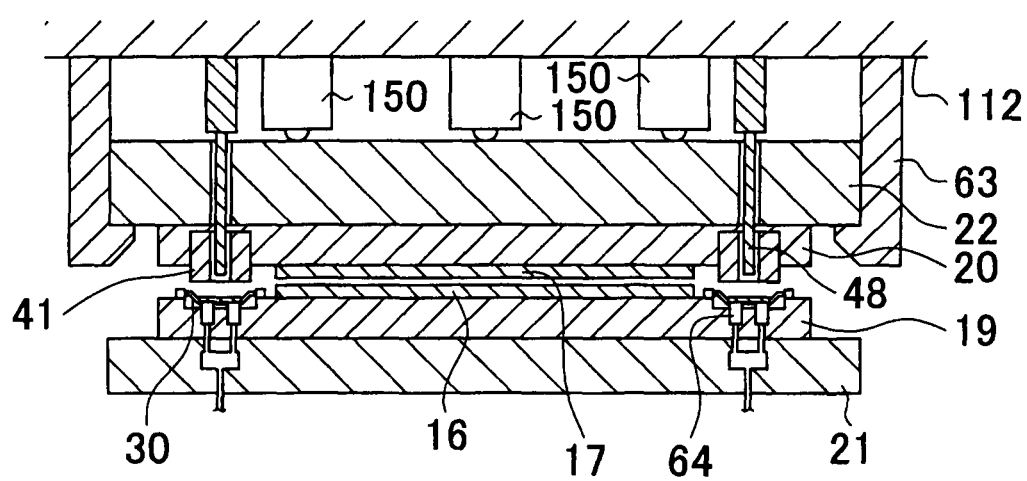
FIG. 21 is a cross-sectional view of the bonding mechanism 13 during the next stage in the process for bonding the wafers 16 and 17.

FIG. 21 is a cross-sectional view of the alignment mechanism 12 at the next stage in the process for bonding the wafers 16 and 17. Compared to the state shown in FIG. 19, the pin component 48 of FIG. 21 is raised to be separated from the magnetic component 40. However, the magnetic component 40 is adhered to the suction unit 64, and so the magnetic component 40 is separated from the magnet 41 by a larger gap $D_1$.

As a result, the magnetic force experienced by the magnetic component 40 is decreased, and so the magnetic component 40 is not adhered to the magnet 41 even when the pin component 48 is distanced therefrom. Furthermore, since the pin component 48 is distanced from the magnetic component 40, there is no contact between the components of the upper and lower tables 21 and 22. Accordingly, by moving the lower table 21, for example, the wafer 16 can be accurately aligned with the wafer 17.

FIG. 22 is a cross-sectional view of the alignment mechanism 12 at the next stage in the process for bonding the wafers 16 and 17. As shown in FIG. 22, when the alignment process of the wafers 16 and 17 is finished, the lower table 21 is raised and the wafers 16 and 17 are bonded.

Raising the lower table 21 causes the first holder 19 to also rise, thereby bringing the magnetic component 40 near the magnet 41. However, the pin component 48 is lowered to prevent the magnetic component 40 from being adhered to the magnet 41. Accordingly, the magnetic component 40 is prevented from being adhered to the magnet 41 when the magnetic component 40 is brought near the magnet 41 and experiences a stronger magnetic force from the magnet 41.

Figure 23:
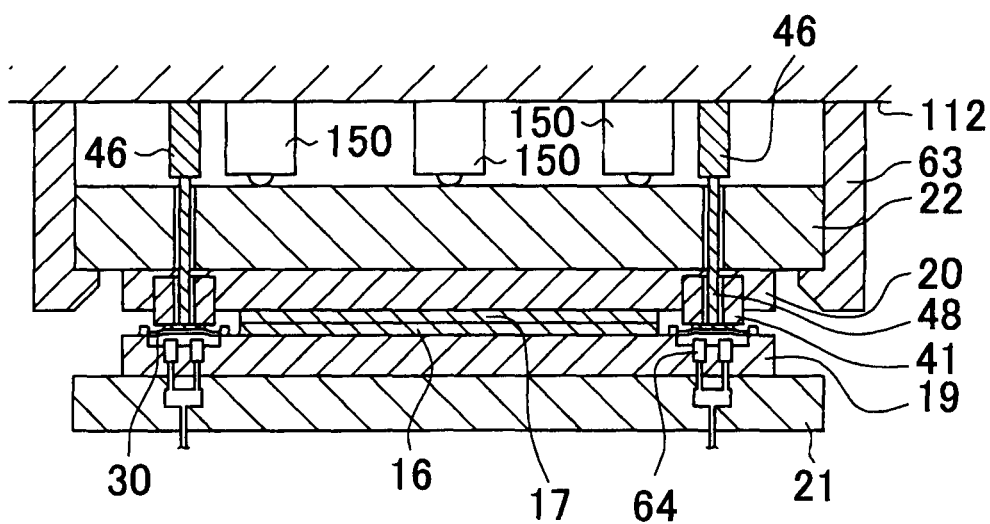
FIG. 23 is a cross-sectional view of the bonding mechanism 13 during the next stage in the process for bonding the wafers 16 and 17.

FIG. 23 is a cross-sectional view of the alignment mechanism 12 at the next stage in the process for bonding the wafers 16 and 17. As shown in FIG. 23, wafers 16 and 17 are already in a bonded state, and the pin component 48 is pulled up. When pulling up the pin component 48, the magnetic component 40 is adhered to the magnet 41 without experiencing a shock by gradually raising the pin component 48 at a slow speed.

Figure 24:
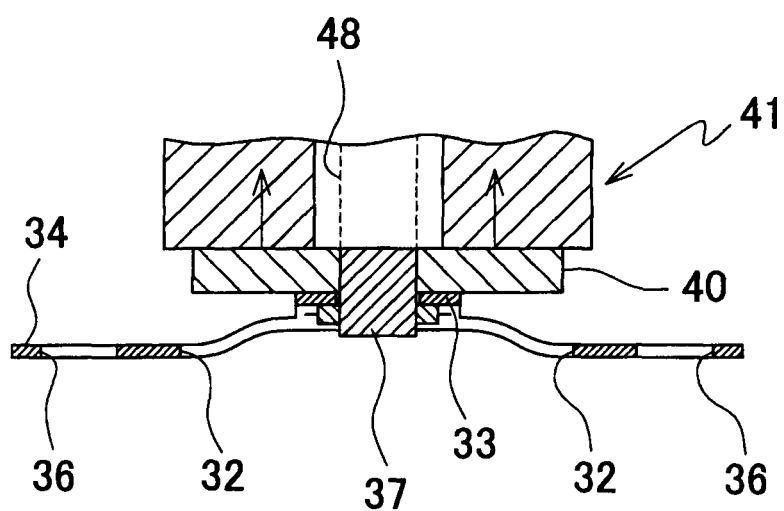
FIG. 24 is a cross-sectional view of the magnetic component 40 and the flat spring component 30 in the state shown in FIG. 23.

FIG. 24 is a magnified cross-sectional view of the region near the magnetic component 40 and the bottom end of the magnet 41 in the state shown in FIG. 23. As shown in FIG. 24, the flat spring component 30 deforms due to the increased magnetic force exerted on the magnetic component 40 by the magnet 41, and so the bottom surface of the magnet 41 and the top surface of the magnetic component 40 firmly contact each other. As a result, the magnetic component 40 is firmly adhered to the magnet 41. Accordingly, the alignment of the wafers 16 and 17 sandwiched between the first holder 19 and the second holder 20 in the bonded state can be reliably held.

Figure 25:
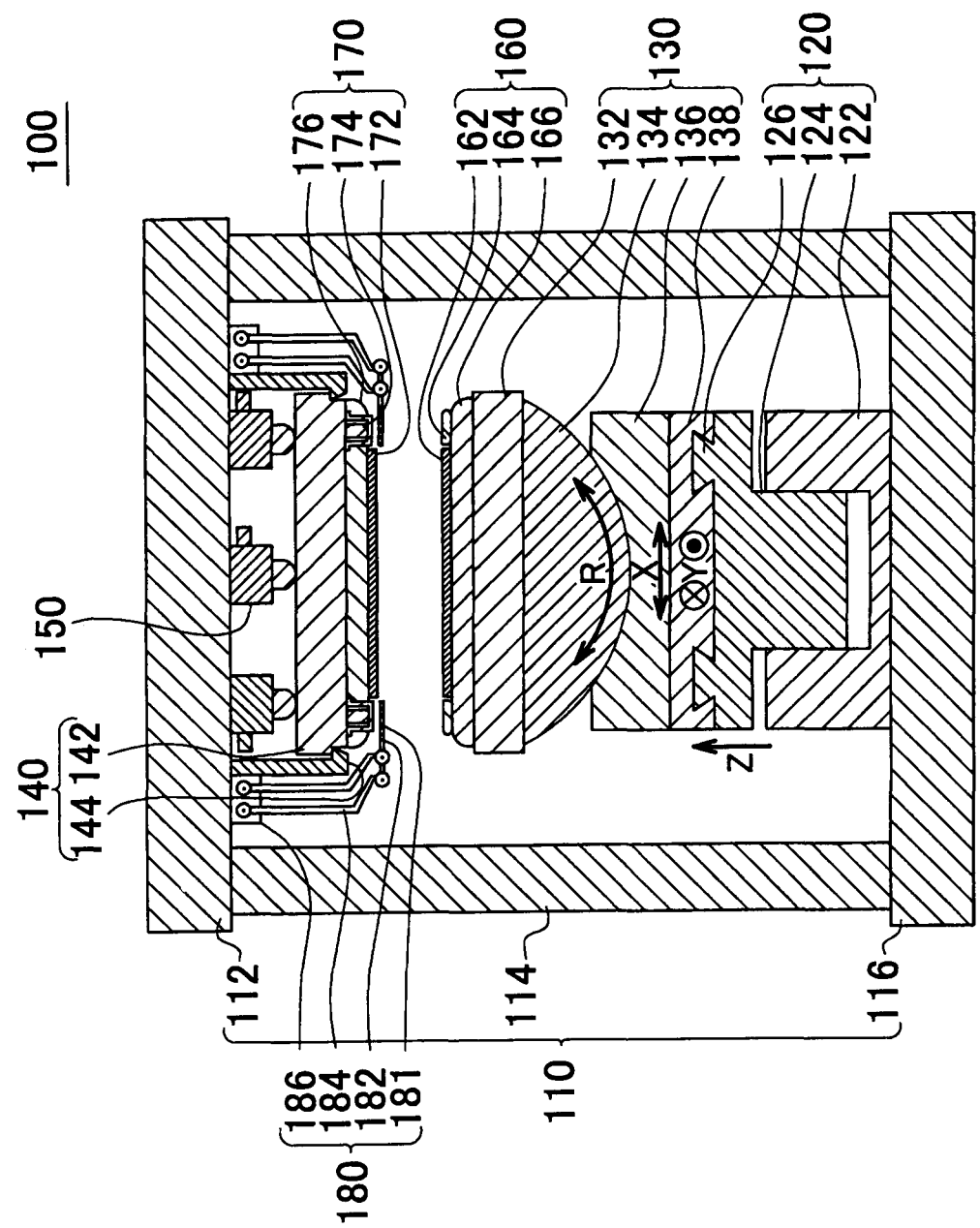
FIG. 25 is a schematic cross-sectional diagram of a configuration of a substrate bonding apparatus 100.

FIG. 25 is a schematic cross-sectional diagram of a configuration of a substrate bonding apparatus 100 used for bonding a first substrate 162 and a second substrate 172. The substrate bonding apparatus 100 includes a first drive unit 120, a pressure-applying stage 130, a pressure-receiving stage 140, a pressure detecting section 150, and a magnetic field control unit 180 arranged within a frame 110. The substrate bonding apparatus 100 is loaded with the first substrate 162 and the second substrate 172 to be bonded and with a first fixing member 166 and a second fixing member 176 that respectively hold the first substrate 162 and the second substrate 172.

The frame 110 includes a top plate 112 and a bottom plate 116 that are horizontal and parallel to each other, and a plurality of support columns 114 that join the top plate 112 and the bottom plate 116 to each other. The top plate 112, the support columns 114, and the bottom plates 116 are all made of material with high rigidity, and do not deform in response to a reactive force of the pressure applied to the first substrate 162 and the second substrate 172 during the bonding, which is described further below.

Inside the frame 110, a first drive unit 120 is arranged on the bottom plate 116. The first drive unit 120 includes a cylinder 122 fixed to the top surface of the bottom plate 116 and a piston 124 arranged inside the cylinder 122. The piston 124 is driven by a hydraulic circuit, a cam, a train, and the like, not shown, to be raised and lowered along the cylinder 122 in a direction indicated by the arrow Z in FIG. 25.

The pressure-applying stage 130 is loaded on the top end of the piston 124. The pressure-applying stage 130 includes a Y stage 138, an X stage 136, a spherical washer 134, and a first fixing member holding member 132. The Y stage 138 is mounted on the top end of the piston 124 via the guide rail 126, and moves in a Y direction that is perpendicular to the plane of FIG. 25. The X stage 136 is mounted on the top surface of the Y stage 138, and moves in a direction parallel to the plane of FIG. 25. The spherical washer 134 is loaded on the X stage 136, and pivots on the X stage 136. The first fixing member holding member 132 is formed on the X stage 136.

The first fixing member 166 is loaded on the first fixing member holding member 132 and holds the first substrate 162 via adhesion. The first fixing member 166 holds the first substrate 162 with the top surface thereof pressed firmly against the first substrate 162. The first fixing member 166 includes a plurality of members to be joined 164 formed of magnetic bodies and positioned around the edge of the first substrate 162.

In other words, the first substrate assembly 160 includes the first substrate 162, the member to be joined 164, and the first fixing member 166, and can be placed in and removed from the substrate bonding apparatus 100.

With this configuration, the X stage 136 and the Y stage 138 operate to move the first substrate 162 loaded on the pressure-applying stage 130 as part of the first substrate assembly 160 in X and Y directions parallel to the bottom plate 116. Furthermore, the operation of the spherical washer 134 causes the first substrate 162 to pivot. The operation of the first drive unit 120 enables the first substrate 162 to be raised and lowered relative to the bottom plate 116.

Inside the frame 110, the pressure-receiving stage 140 and the magnetic field control unit 180 are formed on the bottom surface of the top plate 112. The pressure-receiving stage 140 includes a suspension member 144 and a second fixing member holding member 142. The second fixing member holding member 142 is supported from the bottom surface thereof by a plurality of suspension members 144 hanging from the top plate 112. As a result, the second fixing member holding member 142 can be fixed at a prescribed position while still being able to move upward.

The second fixing member 176 is fixed to the second fixing member holding member 142 and holds the second substrate 172 via adhesion. The second fixing member 176 holds the second substrate 172 with the bottom surface thereof pressed firmly against the second substrate 172. The second fixing member 176 includes a plurality of joining members 174 that include permanent magnets 173 positioned around the edge of the second substrate 172. In other words, the second substrate assembly 170 includes the second substrate 172, the joining member 174, and the second fixing member 176, and can be placed in and removed from the substrate bonding apparatus 100.

The first fixing member holding member 132 and the second fixing member holding member 142 have adhesion mechanisms using electrostatic adhesion, negative pressure adhesion, or the like. Therefore, the first fixing member holding member 132 and the second fixing member holding member 142 can hold the first substrate assembly 160 and the second substrate assembly 170 via adhesion.

The pressure detecting section 150 includes a plurality of load cells that are sandwiched between the top plate 112 and the second fixing member holding member 142. The pressure detecting section 150 restricts the upward movement of the second fixing member holding member 142 and detects pressure applied to the second fixing member holding member 142.

The magnetic field control unit 180 is formed as a restricting component and includes a second drive unit 186, a parallel arm 184, a support member 182, and a high magnetic permeability component 181. The second drive unit 186 is fixed to the top plate 112. The top end of the parallel arm 184 is joined to the second drive unit 186 and the bottom end of the parallel arm 184 is joined to the support member 182. As a result, when the second drive unit 186 operates, the support member 182 moves substantially horizontally.

The high magnetic permeability component 181 is supported on the tip of the support member 182. The high magnetic permeability component 181 is formed of a material having magnetic permeability that is at least higher than that of the member to be joined 164. In the state shown in FIG. 25, the high magnetic permeability component 181 is positioned to cover the bottom surface of the joining member 174. In this state, when the second drive unit 186 operates, the high magnetic permeability component 181 withdraws to the side from the region below the joining member 174.

Figure 26:
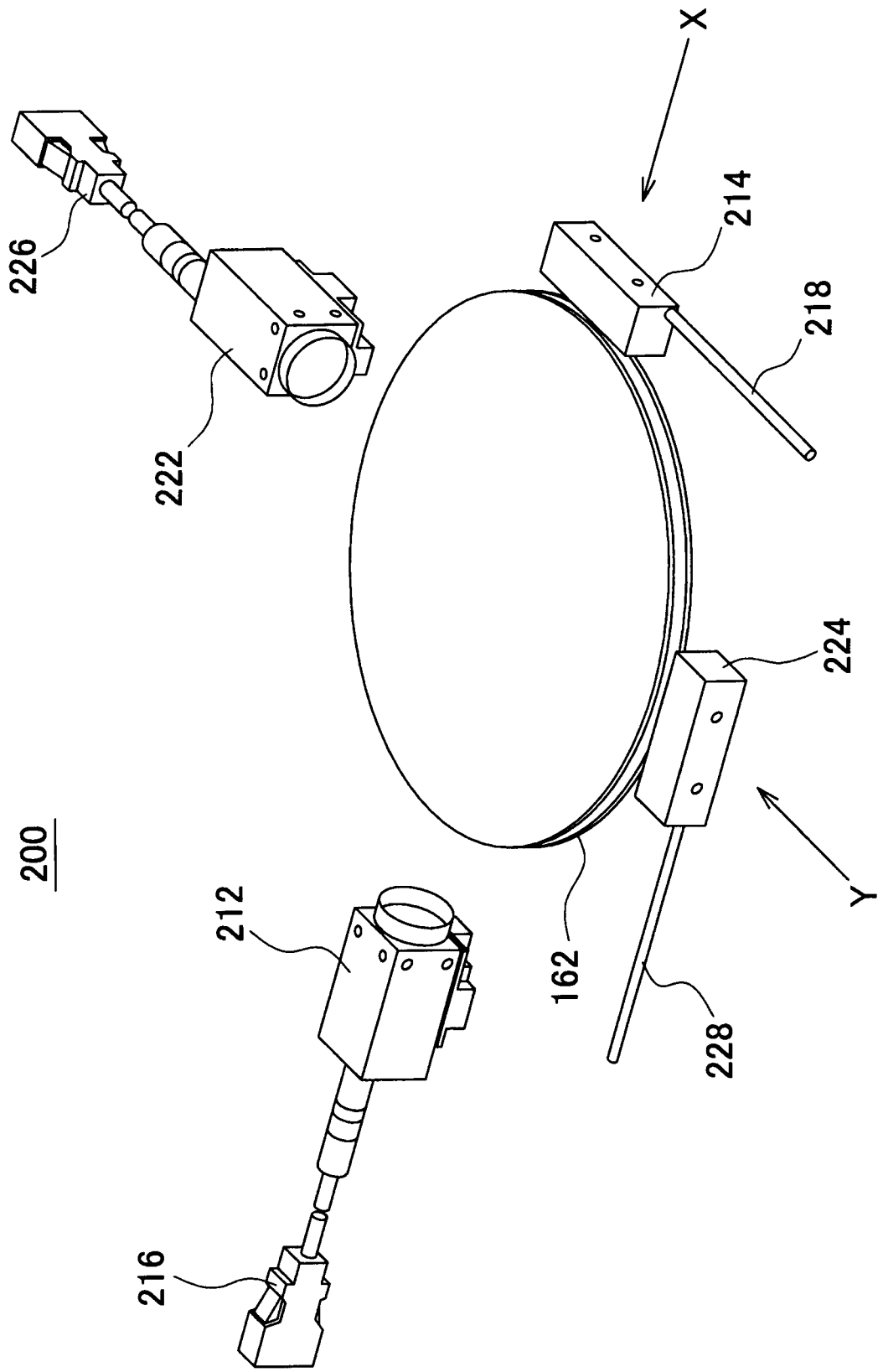
FIG. 26 is a perspective view of a configuration of a position detecting mechanism 200.

FIG. 26 is a perspective view of a configuration of a position detecting mechanism 200 provided in the substrate bonding apparatus 100. The position detecting mechanism 200 is formed by a pair of image capturing units 212 and 222 and a pair of illuminating units 214 and 224. The image capturing units 212 and 222 and the illuminating units 214 and 224 are arranged facing each other at positions sandwiching the first substrate 162 and the second substrate 172 in a plane that is parallel to the bonding plane across which the first substrate 162 and the second substrate 172 face each other.

The image capturing units 212 and 222 send captured images to the outside via connectors 216 and 226, respectively. The illuminating units 214 and 224 are supplied with power from power cables 218 and 228, respectively.

The position and inclination of the second substrate 172 relative to the first substrate 162 can be detected based on the images captured by the image capturing units 212 and 222 arranged in the manner described above. Specifically, when the first substrate 162 is inclined, the image of the inclined first substrate 162 is captured by the image capturing unit 212. When the pressure-applying stage 130 is raised such that the first substrate 162 and the second substrate 172 contact each other, illumination light is blocked from passing between the first substrate 162 and the second substrate 172, and so the contact between the first substrate 162 and the second substrate 172 can be detected based on the image captured by one of the image capturing units 212 and 222.

It should be noted that the resolution of the image capturing units 212 and 222 depends on the resolution of the image capturing elements and optical systems thereof. Accordingly, if the gap between the first substrate 162 and the second substrate 172 is too small to be detected with the resolution of the image capturing units 212 and 222, there may be a lag between the timing at which the first substrate 162 and the second substrate 172 contact each other and the timing at which this contact is detected. However, since only extremely narrow gaps are below the detection threshold of the image capturing units 212 and 222, the first substrate 162 and the second substrate 172 may be treated as being in contact when the gap therebetween is too small to be detected.

The configuration of the position detecting mechanism 200 described above is merely one example, and other configurations that have the same function may be used instead. For example, a position detecting mechanism 200 with higher resolution can be achieved by using an interferometer instead of the image capturing units 212 and 222. As another example, a simpler position detecting mechanism 200 can be achieved by using a linear scale. The type of configuration used can be selected by someone skilled in the art according to the specifications desired for the substrate bonding.

Figure 27:
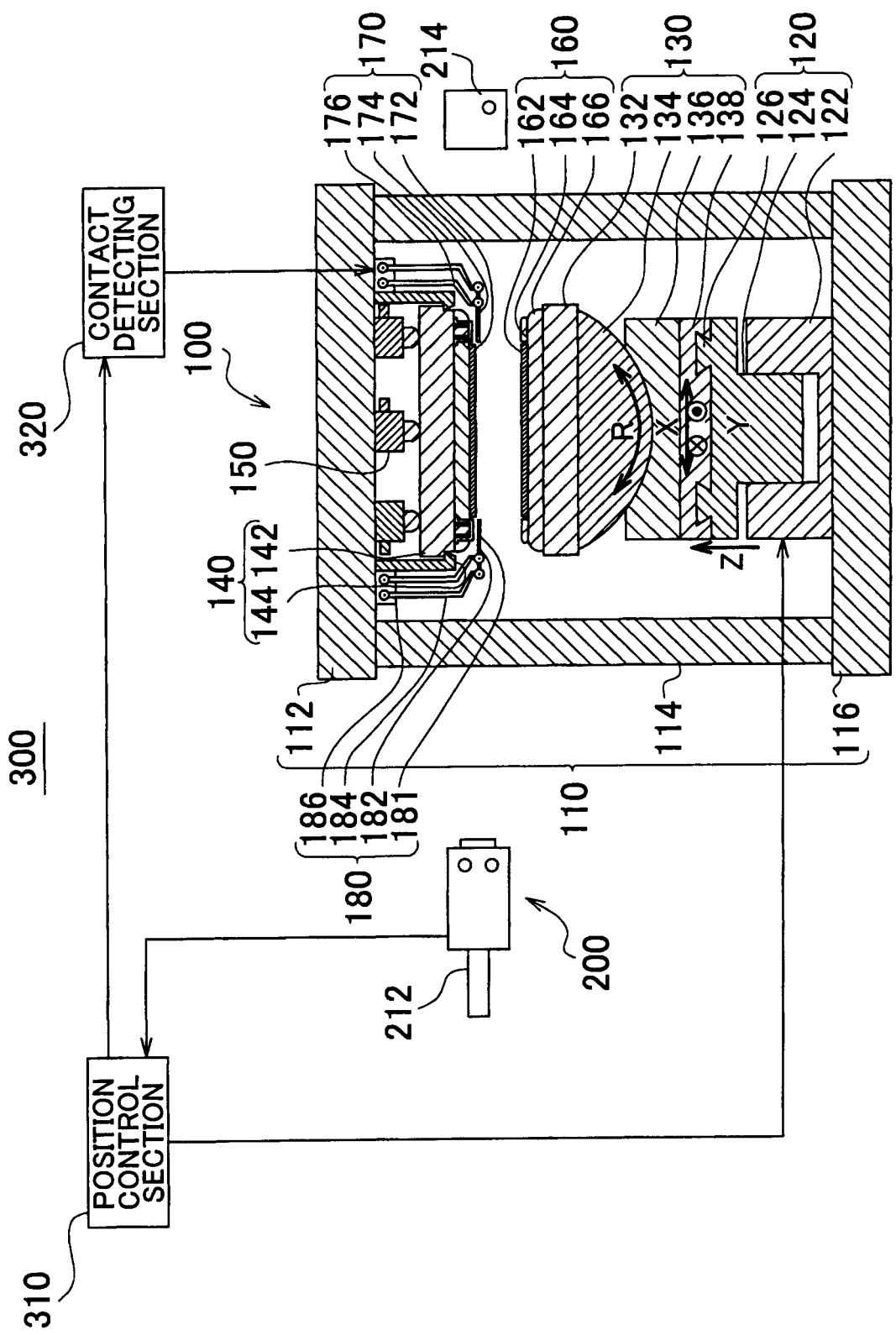
FIG. 27 is a schematic view of a configuration of a control system 300 of the substrate bonding apparatus 100.

FIG. 27 is a schematic view of a configuration of a control system 300 of the substrate bonding apparatus 100. The control system 300 includes a position control section 310 and a contact detecting section 320 that are provided to the substrate bonding apparatus 100 that includes the position detecting mechanism 200.

The position control section 310 controls the operation of each section of the pressure-applying stage 130 while referencing the position and inclination of the first substrate 162 detected by the position detecting mechanism 200. Specifically, the flat spring group 301 changes the height of the first substrate 162 by controlling the first drive unit 120, changes the horizontal position of the first substrate 162 by controlling the Y stage 138 and the X stage 136, and changes the inclination of the first substrate 162 by controlling the spherical washer 134. As a result of this operation, the position of the first substrate 162 is aligned with the position of the second substrate 172, and the first substrate 162 and the second substrate 172 are held parallel to each other.

The contact detecting section 320 causes the second drive unit 186 to operate upon receiving notification that the alignment of the first substrate 162 by the position control section 310 is complete. As a result, the high magnetic permeability component 181 is withdrawn from the position covering the bottom surface of the joining member 174 before being sandwiched between the joining member 174 and member to be joined 164 being joined to each other.

Figure 28:
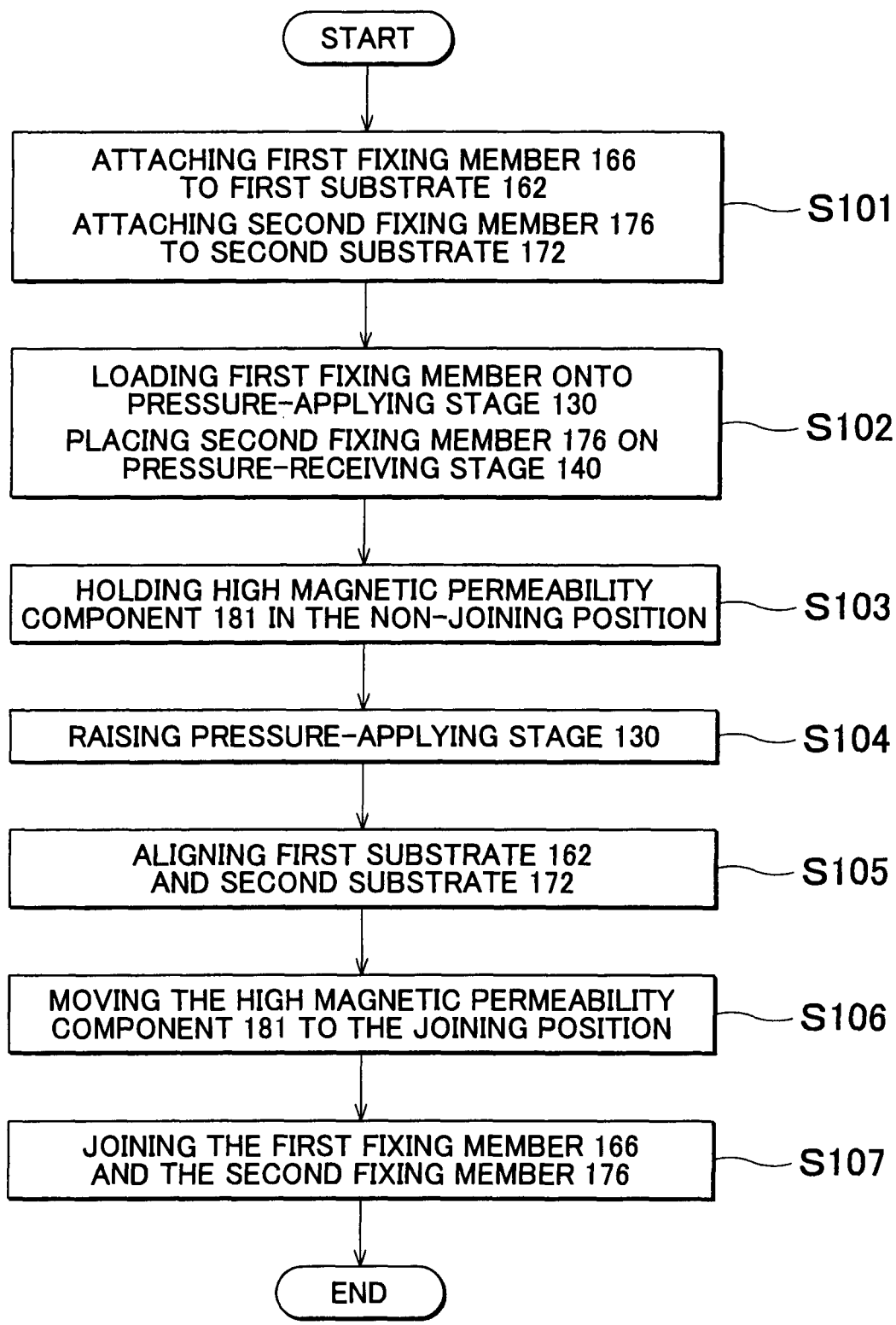
FIG. 28 is a flow chart showing bonding process performed by the substrate bonding apparatus 100.

FIG. 28 is a flow chart showing the steps performed when the first substrate 162 and the second substrate 172 are bonded using the substrate bonding apparatus 100 provided with the position detecting mechanism 200 and the control system 300 described above. When bonding the first substrate 162 and the second substrate 172, first, the first fixing member 166 and the second fixing member 176 are attached respectively to the first substrate 162 and the second substrate 172 (step S101). In this way, the first substrate 162 and the second substrate 172, which are silicon wafers or the like having a large surface are relative to their thickness, can be handled safely and easily.

Next, the first fixing member 166 holding the first substrate 162 is loaded on the first fixing member holding member 132 (step S102). The first fixing member holding member 132 holds and fixes the first fixing member 166 via adhesion such as atmospheric suction. The second fixing member 176 holding the second substrate 172 is placed on the second fixing member holding member 142 (step S102). The second fixing member holding member 142 holds and fixes the second fixing member 176 via adhesion such as atmospheric suction.

Next, the second drive unit 186 operates to move the high magnetic permeability component 181 (step S103). As a result, the high magnetic permeability component 181 is moved to a non-joining position in which the high magnetic permeability component 181 covers the bottom surface of the joining member 174, and is then held in this position. The state of the substrate bonding apparatus 100 at step S103 is shown in FIG. 25.

Next, the first drive unit 120 operates to raise the pressure-applying stage 130 (step S104). As a result, the first substrate 162 gradually moves closer to the second substrate 172. Next, the first substrate 162 and the second substrate 172 are aligned horizontally and the inclination of the first substrate 162 is adjusted to be parallel to the second substrate 172, without the first substrate 162 and the second substrate 172 contacting each other (step S105). As a result, the first substrate 162 and the second substrate 172 are aligned with each other in a state in which bonding is possible.

Upon receiving notification from the position control section 310 that the alignment is complete, the contact detecting section 320 causes the second drive unit 186 to operate. As a result, the high magnetic permeability component 181 withdraws from the non-joining position covering the bottom surface of the joining member 174 to a joining position (step S106).

In this way, with the first substrate 162 and the second substrate 172 aligned and with the high magnetic permeability component 181 withdrawn to the joining position, the pressure-applying stage 130 is again raised by the first drive unit 120 to bond the first substrate 162 and the second substrate 172 (step S107). At this time, the high magnetic permeability component 181 is withdrawn such that he joining member 174 and the member to be joined 164, which directly face each other, are also bonded. As a result, the first substrate 162 and the second substrate 172 are sandwiched between the first fixing member 166 and the second fixing member 176 joined to the member to be joined 164 and the joining member 174, and are thereby held in this bonded state.

The above describes a bonding method for setting the first substrate 162 and the second substrate 172 in an aligned state, and this method includes (i) supporting one of the first substrate 162 and the second substrate 172 on the first fixing member 166 having the member to be joined 164 that includes the magnetic body, (ii) supporting the other of the first substrate 162 and the second substrate 172 on the second fixing member 176 having the joining member 174 that is joined to the member to be joined 164 and that includes the permanent magnet 173, and (iii) when the member to be joined 164 and the joining member 174 are brought near each other, restricting the adhesion of the member to be joined 164 and the joining member 174 until the gap therebetween reaches a prescribed distance. As a result, the first substrate 162 and the second substrate 172 can be accurately aligned without being affected by the magnetic force, and the bonded first substrate 162 and second substrate 172 can be held autonomously by the first fixing member 166 and the second fixing member 176.

Figure 29:
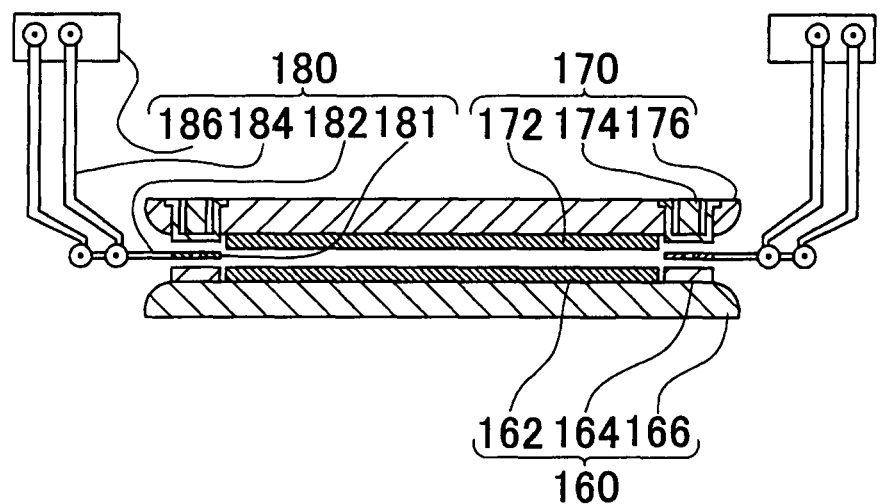
FIG. 29 is a view of the extracted fixing member at step S105.

FIG. 29 shows the state of the substrate bonding apparatus 100 at step S105. In FIG. 29, the first substrate assembly 160, second substrate assembly 170, and magnetic field control unit 180 are extracted and enlarged. Components that are the same as those in FIG. 25 are given the same reference numerals, and redundant descriptions are omitted.

At step S105, the first substrate 162 is raised to be closer to the second substrate 172 than at step S103 shown in FIG. 25. It should be noted that, at this step, the first substrate 162 and the second substrate are still separated from each other, and the joining member 174 and member to be joined 164 are also separated from each other. Furthermore, the high magnetic permeability component 181 is positioned between the joining member 174 and the member to be joined 164.

Figure 30:
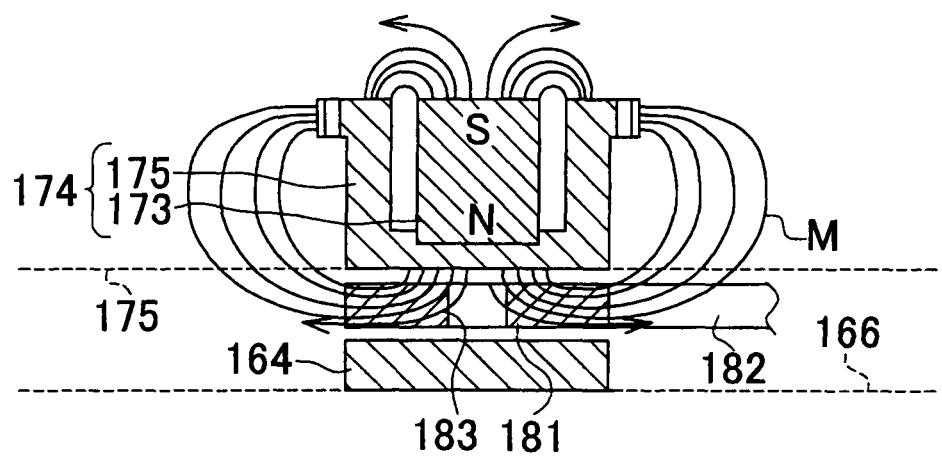
FIG. 30 is a schematic view of the magnetic circuit formed in the state shown in FIG. 29.

FIG. 30 is a schematic view of the magnetic circuit formed near the joining member 174 and the member to be joined 164 in the state shown in FIG. 29. The joining member 174 includes the permanent magnet 173 and an attaching member 175 that fixes the permanent magnet 173 to the second fixing member 176. The high magnetic permeability component 181 includes a through-hole 183 at a position corresponding to the geometrical center of the joining member 174.

The permanent magnet 173 is magnetized to have poles oriented in a direction orthogonal to the surface orientation of the first substrate 162 and the second substrate 172. As a result, a magnetic field is formed near the joining member 174 by the magnetic force lines M that form arcs connecting the poles of the permanent magnet 173.

However, the high magnetic permeability component 181 is inserted between the joining member 174 and the member to be joined 164 to cover the bottom surface of the joining member 174. Therefore, the majority of the magnetic force lines distributed below the joining member 174 pass through the high magnetic permeability component 181. As a result, the magnetic field does not extend below the high magnetic permeability component 181, and so the member to be joined 164 is not affected by the attractive magnetic force of the permanent magnet 173.

By using the high magnetic permeability component 181 to block the magnetic field of the permanent magnet 173 from reaching the member to be joined 164 in this way, the joining member 174 and the member to be joined 164 experience very little attractive force, regardless of how close they are to each other. Accordingly, the position control section 310 can perform the alignment accurately without being affected by the magnetic force of the joining member 174.

Since the temperature increases during the bonding process of the first substrate 162 and the second substrate 172, the permanent magnet 173 is desirably a heat-resistance magnet. Furthermore, as shown in FIG. 30, the density of the magnetic force lines generated by the permanent magnet 173 is lower at the position of the geometrical center thereof. Accordingly, the same function can be achieved by providing the through-hole 183 at this position and omitting the high magnetic permeability component 181.

Figure 31:
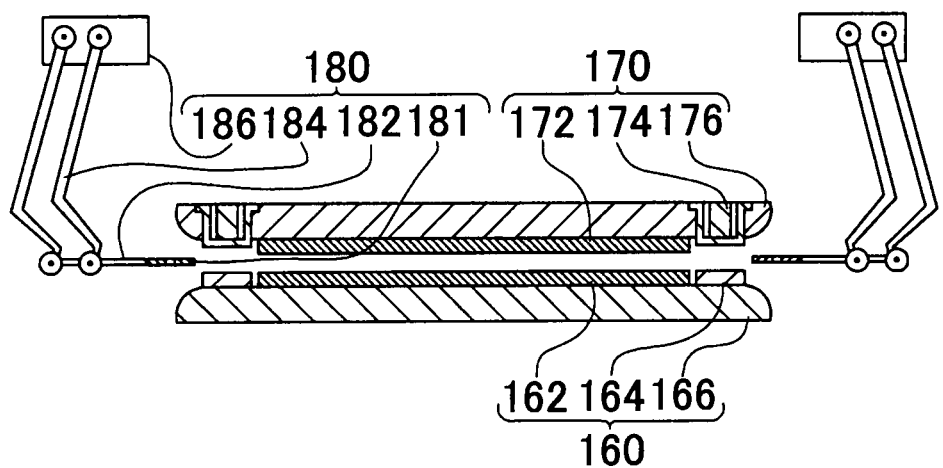
FIG. 31 is a view of the extracted fixing member at step S106.

FIG. 31 shows a state of the substrate bonding apparatus 100 at step S106. In FIG. 31 as well, the first substrate assembly 160, second substrate assembly 170, and magnetic field control unit 180 are extracted and enlarged. Components that are the same as those in FIG. 25 are given the same reference numerals, and redundant descriptions are omitted.

At step S106, the first substrate 162 and the second substrate 172 are still separated from each other, and the joining member 174 and member to be joined 164 are also separated from each other. It should be noted that, at this step, the high magnetic permeability component 181 is withdrawn from the non-joining position between the joining member 174 and the member to be joined 164 to the joining position. As a result, the joining member 174 and the member to be joined 164 face each other directly.

FIG. 32 is a schematic view of the magnetic circuit formed in the state shown in FIG. 31. Since the high magnetic permeability component 181 is withdrawn from between the joining member 174 and the member to be joined 164, the magnetic force lines M generated by the permanent magnet 173 form a magnetic field that extends below the joining member 174. As a result, the magnetic force lines M of the permanent magnet 173 affect the member to be joined 164, thereby causing the member to be joined 164 to be attracted to the joining member 174. By withdrawing the high magnetic permeability component 181 to the joining position in this way, the joining member 174 and the member to be joined 164 are drawn together by the magnetic force of the permanent magnet 173.

Figure 33:
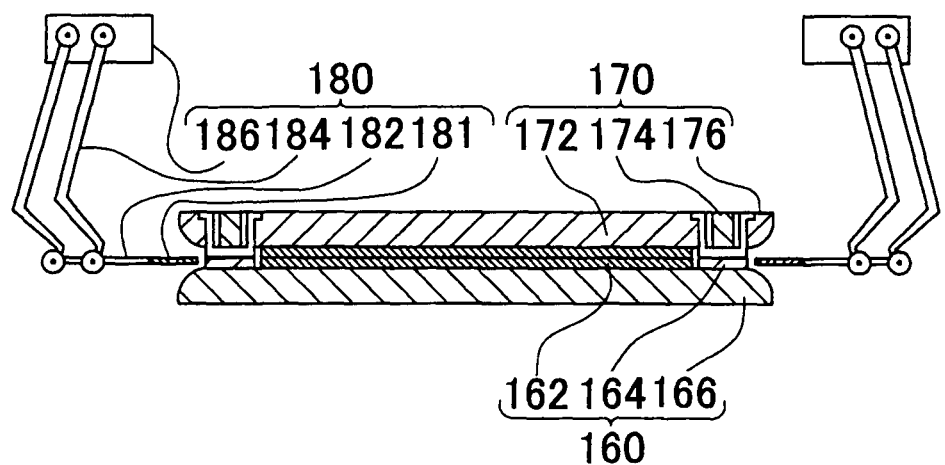
FIG. 33 is a view of the extracted fixing member at step S107.

FIG. 33 shows a state of the substrate bonding apparatus 100 at step S107. In FIG. 33 as well, the first substrate assembly 160, second substrate assembly 170, and magnetic field control unit 180 are extracted and enlarged. Components that are the same as those in FIG. 25 are given the same reference numerals, and redundant descriptions are omitted.

At step S107, the first substrate 162 and the second substrate firmly contact each other to be bonded. The joining member 174 and the member to be joined 164 are also directly joined to each other. As a result, the first substrate 162 and the second substrate 172 are sandwiched by the first fixing member 166 and the second fixing member 176 joined to the member to be joined 164 and the joining member 174, and are thereby held in the bonded state.

Figure 34:
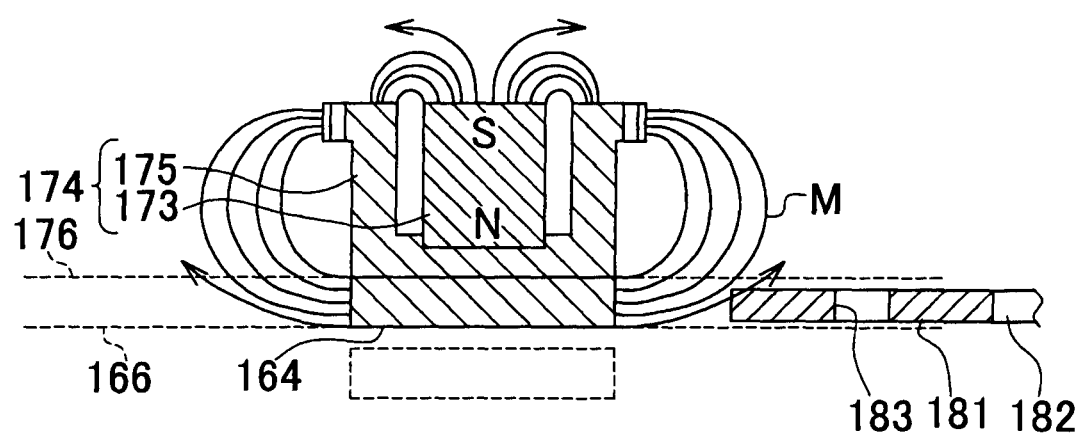
FIG. 34 is a schematic view of the magnetic circuit formed in the state shown in FIG. 33.

FIG. 34 is a schematic view of the magnetic circuit formed in the state shown in FIG. 33. Since the joining member 174 and the member to be joined 164 are already bonded, the magnetic force lines M generated by the permanent magnet 173 pass through the member to be joined 164 bonded to the joining member 174. As a result, the member to be joined 164 is firmly bonded to the joining member 174, thereby holding the first substrate 162 and the second substrate 172 in the bonded state.

The above describes a substrate bonding apparatus 100 that sets the first substrate 162 and the second substrate 172 in an aligned state, and this substrate bonding apparatus 100 includes (i) the first fixing member holding member 132 that holds the first fixing member 166 supporting one of the first substrate 162 and the second substrate 172, which has the member to be joined 164 including the magnetic body, (ii) the second fixing member holding member 142 that holds the second fixing member 176 joined to the member to be joined 164 including the permanent magnet 173, (iii) the first drive unit 120 that drives one of the first fixing member holding member 132 and the second holding member supporting member 142 toward the other, (iv) and the magnetic field control unit 180 that, when the member to be joined 164 and the joining member 174 move toward each other, restricts adhesion between the member to be joined 164 and the joining member 174 until the gap therebetween reaches a prescribed distance. As a result, the first substrate 162 and the second substrate 172 can be accurately aligned without being affected by the magnetic force, and the bonded first substrate 162 and second substrate 172 can be held autonomously by the first fixing member 166 and the second fixing member 176.

In the substrate bonding apparatus 100 described above, the magnetic field control unit 180 is provided in the substrate bonding apparatus 100. However, by providing the magnetic field control unit 180 to at least one of the first fixing member 166 and the second fixing member 176, a substrate holding unit capable of the above operations can be achieved without relying on the substrate bonding apparatus 100.

In this case, the second drive unit 186 may be provided to a portion of the first fixing member 166 or the second fixing member 176, and the high magnetic permeability component 181 can be controlled by supplying a current, voltage, or the like from the outside. Furthermore, the first fixing member 166 or the second fixing member 176 may be provided with an energy source, such as a battery.

Described above is a substrate holding unit that holds the first substrate 162 and the second substrate 172 in an aligned state, and this substrate holding unit includes (i) the first fixing member 166 that supports one of the first substrate 162 and the second substrate 172 and has the member to be joined 164 including the magnetic body, (ii) the second fixing member 176 that supports the other of the first substrate 162 and the second substrate 172 and has the joining member 174 joined to the member to be joined 164, which includes the permanent magnet 173, and (iii) the magnetic field control unit 180 that, when the member to be joined 164 and the joining member 174 move toward each other for bonding, restricts adhesion between the member to be joined 164 and the joining member 174 until the gap therebetween reaches a prescribed distance. As a result, the first substrate 162 and the second substrate 172 can be accurately aligned without being affected by the magnetic force, and the bonded first substrate 162 and second substrate 172 can be held autonomously by the first fixing member 166 and the second fixing member 176.

Figure 35A:
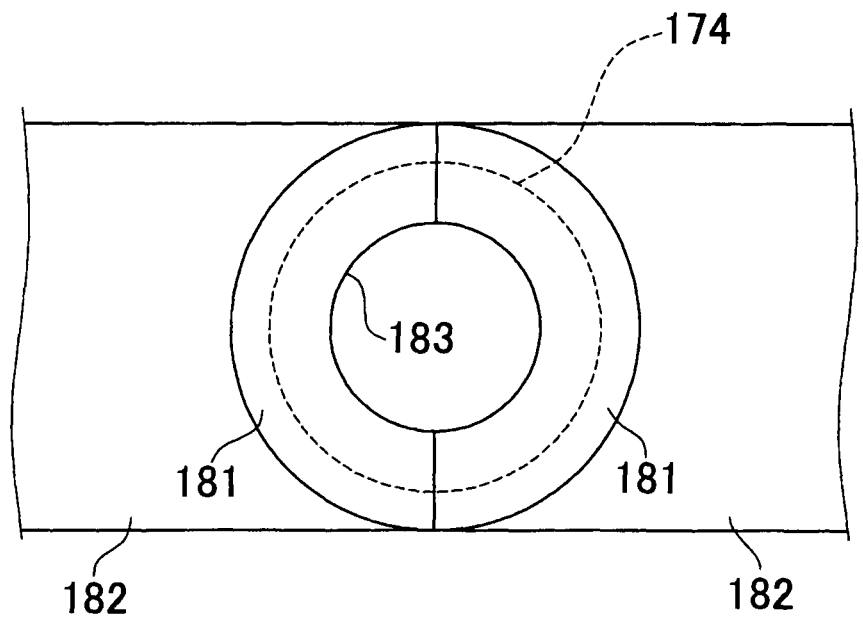
FIGS. 35A and 35B show other embodiments of the high magnetic permeability component 181.
Figure 35B:
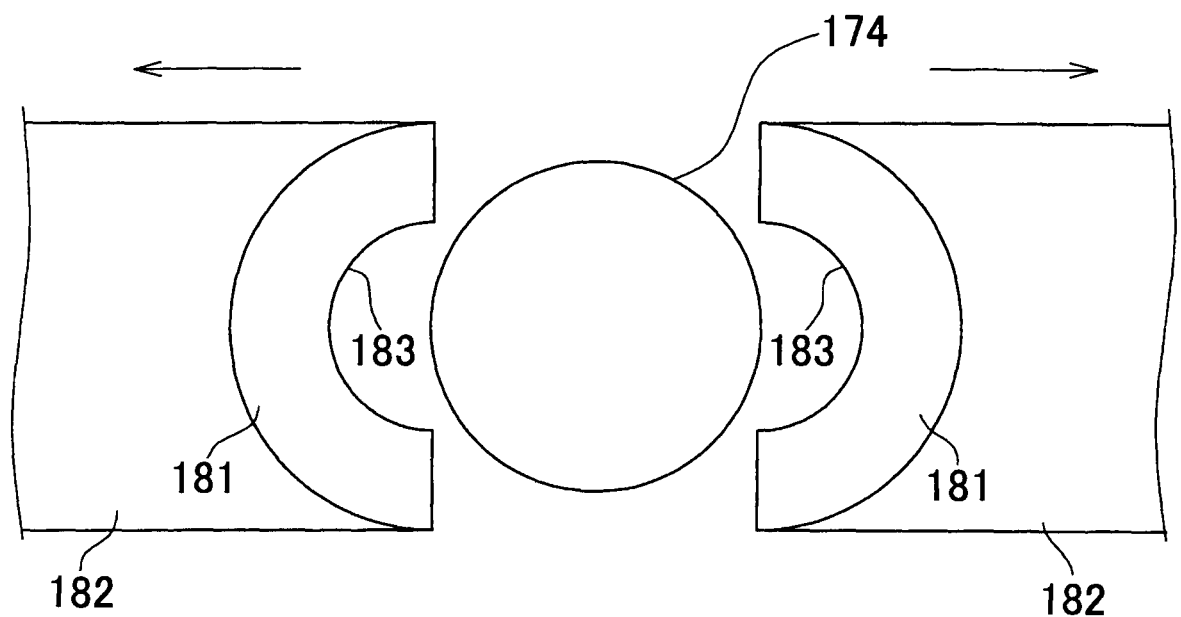

FIGS. 35A and 35B show other embodiments of the high magnetic permeability component 181. In FIGS. 35A and 35B, components that are the same as those in other embodiments are given the same reference numerals, and redundant descriptions are omitted.

FIG. 35A shows the joining member 174 as seen from above when the high magnetic permeability component 181 is in the non-joining position to cover the bottom surface of the joining member 174. As shown in FIG. 35A, the high magnetic permeability component 181 has the through-hole 183 at a position corresponding to the geometric center of the joining member 174. The high magnetic permeability component 181 is divided through the center thereof to be separated longitudinally.

FIG. 35B shows a state in which the high magnetic permeability component 181 is moved to the joining position, as seen from the same point of view as FIG. 35A. As shown in FIG. 35B, the separated high magnetic permeability component 181 is withdrawn in two opposite directions to expose the bottom surface of the joining member 174. The movement direction of the high magnetic permeability component 181 in this embodiment is orthogonal to the movement direction of the high magnetic permeability component 181 shown in FIGS. 25 to 34, i.e. the movement direction is the same direction as a line connecting the first substrate 162 and the second substrate 172.

With this configuration, the amount of movement is decreased when the high magnetic permeability component 181 moves from the non-joining position to the joining position, thereby shortening the movement time. Furthermore, when the high magnetic permeability component 181 moves, the effect of the magnetic field generated by the joining member 174 is symmetric, and so the effect on the alignment of the first substrate 162 and the second substrate 172 is further decreased.

In this way, the high magnetic permeability component 181 may include the through-hole 183 positioned to correspond to the geometrical center of the joining member 174. As a result, the high magnetic permeability material is conserved to decrease the cost of the materials.

The high magnetic permeability component 181 may include a plurality of regions that move symmetrically relative to the geometrical center of the first fixing member 166 in a direction of the surface orientations of the first substrate 162 and the second substrate 172 when the high magnetic permeability component 181 moves from the non-joining position to the joining position. As a result, the movement time of the high magnetic permeability component 181 can be shortened and the affect on the alignment of the first substrate 162 and the second substrate 172 can be further decreased.

Figure 36:
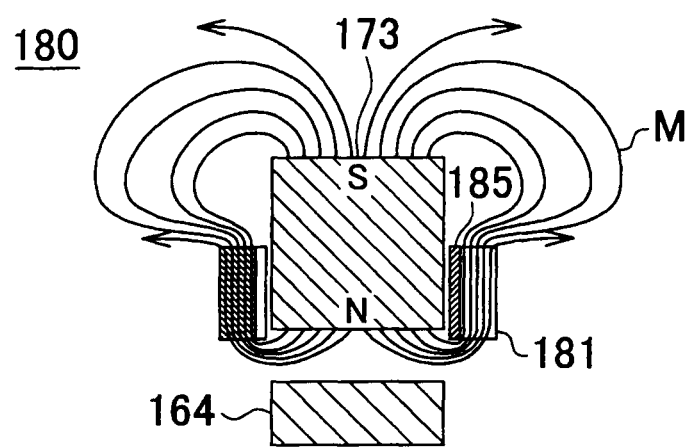
FIG. 36 shows the magnetic field control unit 180 according to another embodiment in the non-joining state.

FIG. 36 shows the state of the high magnetic permeability component 181 in the non-joining position in the magnetic field control unit 180 according to another embodiment. This magnetic field control unit 180 is formed of a cylindrical high magnetic permeability component 181 with an inner diameter through which the permanent magnet 173 is inserted. The bottom end of the high magnetic permeability component 181 is lower than the bottom end of the permanent magnet 173 when in the non-joining position.

As a result, the magnetic force lines M generated by the permanent magnet 173 pass through the high magnetic permeability component 181 at the bottom end side of the permanent magnet 173 facing the member to be joined 164. Therefore, the magnetic field formed by the magnetic force lines M is drawn away from the member to be joined 164, and so the member to be joined 164 is not affected by the magnetic attractive force of the permanent magnets 173.

The inner surface of the high magnetic permeability component 181 is covered by a sliding component 185 formed of a material with low friction resistance. As a result, the movement of the high magnetic permeability component 181 is not impeded when contacting the permanent magnet 173.

Figure 37:
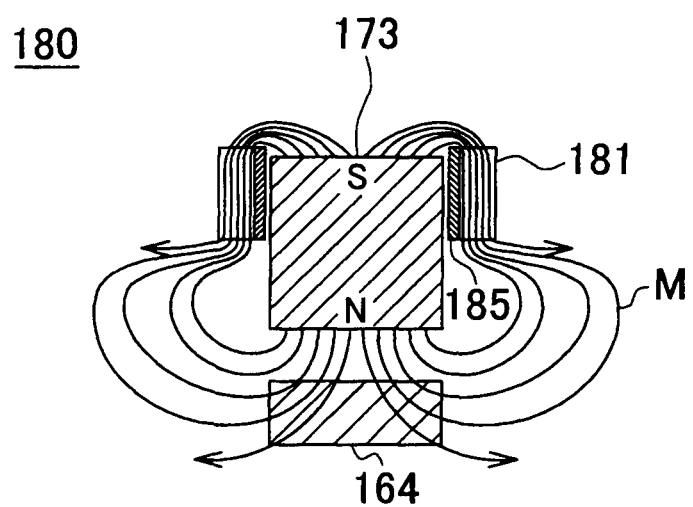
FIG. 37 shows the state of the magnetic field control unit 180 shown in FIG. 36.

FIG. 37 shows the state of the high magnetic permeability component 181 in the joining position in the magnetic field control unit 180 shown in FIG. 36. In this magnetic field control unit 180, the bottom end of the high magnetic permeability component 181 is higher than the bottom end of the permanent magnet 173, and this is the joining position. As a result, the magnetic force lines M generated by the permanent magnet 173 expand to the member to be joined 164, such that the member to be joined 164 is positioned within the magnetic field formed by the magnetic force lines M. Accordingly, the member to be joined 164 is adhered to the joining member 174.

In this way, the high magnetic permeability component 181 has the through-hole 183 with larger dimensions than the joining member 174 in directions corresponding to the orientation of the surfaces of the first substrate 162 and the second substrate 172, and the joining member 174 may be inserted through the through-hole 183 when the high magnetic permeability component 181 moves from the non-joining position to the joining position. As a result, the symmetry of the magnetic field generated by the joining member 174 can be maintained while allowing the high magnetic permeability component 181 to move between the joining position and the non-joining position. Furthermore, the movement amount of the high magnetic permeability component 181 does not increase when the dimensions of the joining member 174 increase.

FIG. 38 shows the state of the high magnetic permeability component 181 in the non-joining position in the magnetic field control unit 180 according to another embodiment. This magnetic field control unit 180 includes a plurality of permanent magnets 173 that are polarized in a direction of the orientation of the surfaces of the first substrate 162 and the second substrate 172. Each permanent magnet 173 is arranged such that poles with the same polarity are facing each other between adjacent permanent magnets 173.

The magnetic field control unit 180 also includes a plurality of high magnetic permeability components 181 that form yokes that respectively cover the bottom surface of each permanent magnet 173 in the non-joining position. As a result, the poles of each permanent magnet 173 are directly coupled with the corresponding high magnetic permeability component 181, such that the magnetic force lines M generated by each permanent magnet 173 do not form a magnetic field outside of the high magnetic permeability component 181. Accordingly, there is no magnetic field affecting the member to be joined 164, and so the member to be joined 164 is not adhered to the permanent magnets 173.

Figure 39:
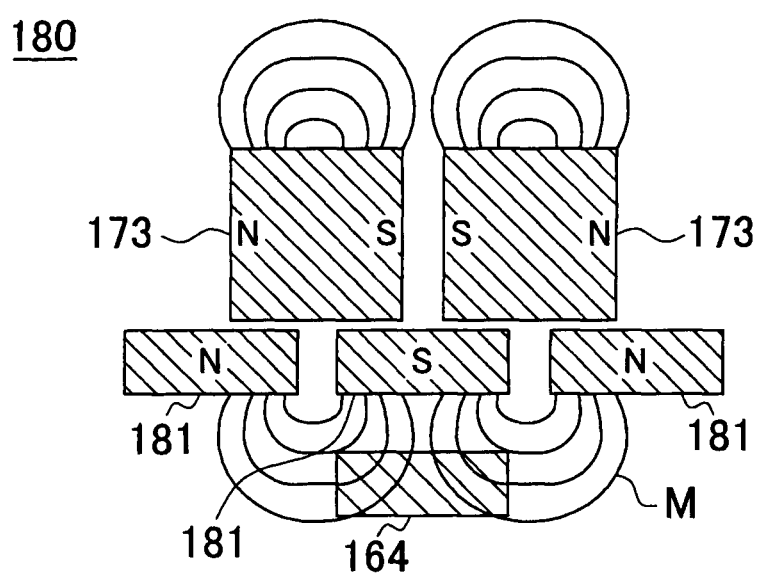
FIG. 39 shows the state of the magnetic field control unit 180 shown in FIG. 38.

FIG. 39 shows the state of the high magnetic permeability component 181 in the joining position in the magnetic field control unit 180 shown in FIG. 38. In this magnetic field control unit 180, the high magnetic permeability component 181 moves horizontally to the joining positions, so that same-polarity poles of adjacent permanent magnet 173 are joined with each other. As a result, the magnetic force lines M generated by the permanent magnets 173 expand toward the member to be joined 164, so that the member to be joined 164 is positioned within the magnetic field formed by the magnetic force lines M. Accordingly, the member to be joined 164 is adhered to the joining member 174.

In this way, the high magnetic permeability component 181 that includes a plurality of permanent magnets 173 polarized in a direction of the surface orientation of the first substrate 162 and the second substrate 172 and arranged to have same-polarity poles thereof facing each other connects opposite-polarity poles of the permanent magnets to each other when in the non-joining position and connects same-polarity poles of adjacent permanent magnets to each other when in the joining position. As a result, the attractive force exerted on the member to be joined 164 when in the joining position can be increased, and the magnetic force lines can be efficiently blocked when in the non-joining position.

In the above embodiments, the restricting component is formed using the high magnetic permeability component 181, but the configuration of the restricting component is not limited to this. For example, the magnetic field can be kept away from the member to be joined 164 by using other permanent magnets, electromagnets, and the like to cancel out the magnetic field generated by the permanent magnet 173. It should be noted that, since operating electromagnets generate heat, this heat might affect the alignment of the first substrate 162 and the second substrate 172. Accordingly, when using electromagnets, the operational time of these electromagnets is desirably kept short.

Figure 40:
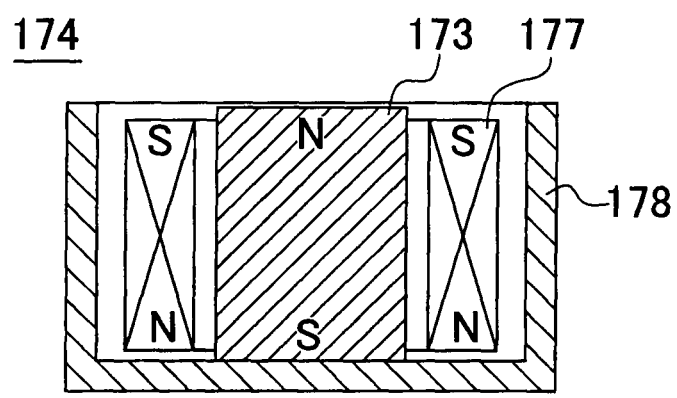
FIG. 40 is a cross-sectional view of another embodiment of the joining member 174.

FIG. 40 is a cross-sectional view of another embodiment of the joining member 174. This joining member 174 includes the permanent magnet 173 and a magnetic field generating coil 177 housed in a case 178 on the same axis.

The permanent magnet 173 is polarized to have specific poles at the top and bottom ends thereof. In the example of FIG. 40, the bottom end is an S pole and the top end is an N pole, but the pole orientation is not limited to this.

When current flows, the magnetic field generating coil 177 generates a magnetic field that is the inverse of the polarity of the permanent magnet 173. As a result, the magnetic field generated by the magnetic field generating coil 177 cancels out the magnetic field generated by the permanent magnet 173, and so there is almost no magnetic force outside of the case 178.

When such a joining member 174 is provided in the bonding apparatus 100, the magnetic field generating coil 177 operates until the alignment of the first substrate 162 and the second substrate 172 is complete, so that the member to be joined 164 does not generate an adhesive magnetic force. When the alignment is finished and the first substrate 162 and the second substrate 172 are to be bonded, the inverse polarity magnetic field generated by the magnetic field generating coil 177 is gradually decreased such that the member to be joined 164 is adhered without experiencing a shock. The magnetic field generating coil 177 operates only during the alignment of the first substrate 162 and the second substrate 172, and so the effect of the heat generated by the magnetic field generating coil 177 on the accuracy of the alignment is minimized.

Figure 41:
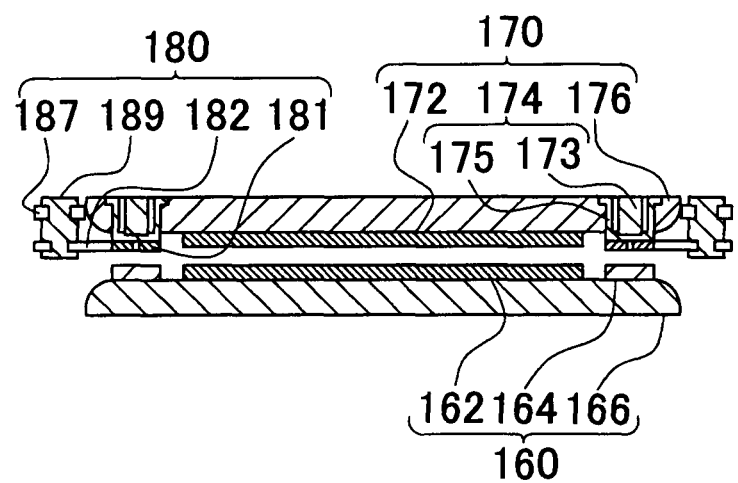
FIG. 41 shows the configuration of the magnetic field control unit 180 according to another embodiment.

FIG. 41 shows a configuration of the magnetic field control unit 180 according to another embodiment. Except for the magnetic field control unit 180 being mounted in the second substrate assembly 170, the configuration of the first substrate assembly 160 and the second substrate assembly 170 shown in FIG. 41 is the same as in the other embodiments. Therefore, components that are the same as those in the other embodiments are given the same reference numerals, and redundant explanations are omitted.

The magnetic field control unit 180 includes a bracket 187, a bearing section 189, a support member 182, and the high magnetic permeability component 181. The bracket 187 is mounted on the outer end surface of the second fixing member 176, and extends radially outward from the second fixing member 176. The bearing section 189 extends perpendicularly downward from the bracket 187.

One end of the support member 182 is near the bottom end of the bearing section 189 and is supported to rotate in a horizontal plane. The other end of the support member 182 supports the high magnetic permeability component 181. In the state shown in FIG. 41, the high magnetic permeability component 181 is positioned directly below the bottom end surface of the joining member 174.

As a result, the majority of the magnetic flux generated by the permanent magnet 173 passes through the high magnetic permeability component 181, as described above in FIG. 30. Accordingly, the magnetic field of the permanent magnet 173 is kept away from the member to be joined 164 on the first substrate assembly 160 side, and so the member to be joined 164 is not adhered to the joining member 174. In other words, the first substrate assembly 160 can be positioned relative to the second substrate assembly 170 without being affected by the magnetic field of the permanent magnet 173.

Figure 42:
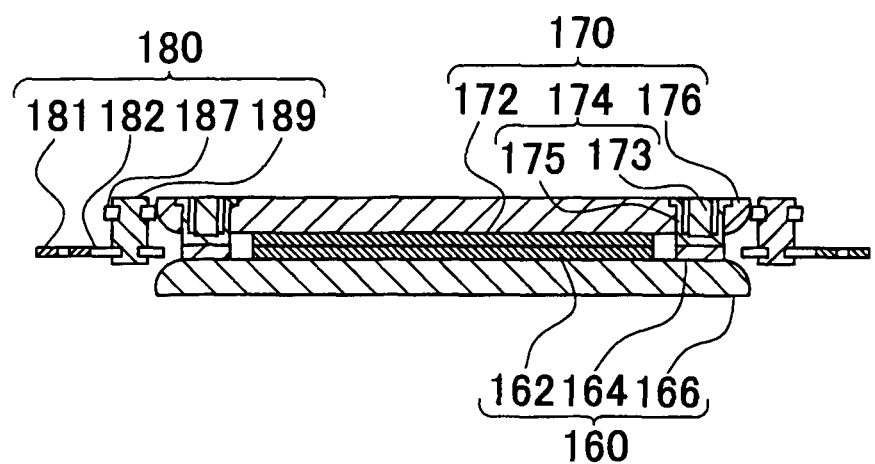
FIG. 42 shows the operation of the magnetic field control unit 180 shown in FIG. 41.

FIG. 42 shows operation of the magnetic field control unit 180 shown in FIG. 41. As shown in FIG. 42, the high magnetic permeability component 181 is kept away from the joining member 174 by causing the support member 182 rotating around the bearing section 189. As a result, the magnetic field of the permanent magnet 173 expands downward to adhere the member to be joined 164. Accordingly, the first substrate 162 fixed to the first fixing member 166 is pressed against the second substrate 172, thereby bonding the first substrate 162 and the second substrate 172.

Figure 43:
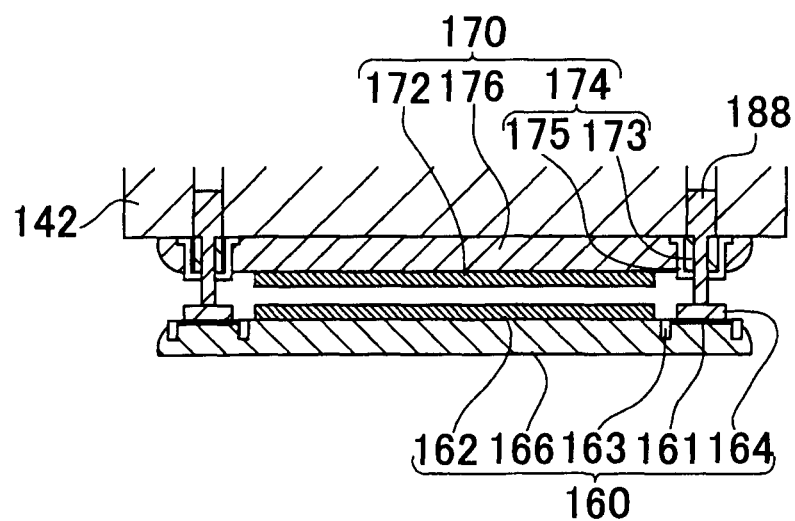
FIG. 43 shows an extracted portion of the substrate bonding apparatus 100 according to another embodiment.

FIG. 43 shows an extracted portion of the substrate bonding apparatus 100 according to another embodiment. Aside from the portions described below, this substrate bonding apparatus 100 has the same configuration as the substrate bonding apparatus 100 of the other embodiments. Therefore, components that are the same as those of other embodiments are given the same reference numerals, and redundant descriptions are omitted.

In the substrate bonding apparatus 100, the second fixing member holding member 142 includes a push pin 188 that penetrates vertically through the permanent magnet 173 and the attaching member 175 to extend below the joining member 174. The bottom end of the push pin 188 contacts the top surface of the member to be joined 164 of the first substrate assembly 160. As a result, even when the member to be joined 164 is attracted to the joining member 174, adhesion is prevented. Accordingly, adhesion between the first substrate 162 and the second substrate 172 is also prevented.

In the substrate bonding apparatus 100, the member to be joined 164 is mounted via a flat spring 161 whose ends are fixed relative to the first fixing member 166 by a stopper 163. The flat spring 161 biases the member to be joined 164 toward the first fixing member 166. As a result, in the state shown in FIG. 43, the member to be joined 164 and the flat spring 161 firmly contact the first fixing member 166.

Figure 44:
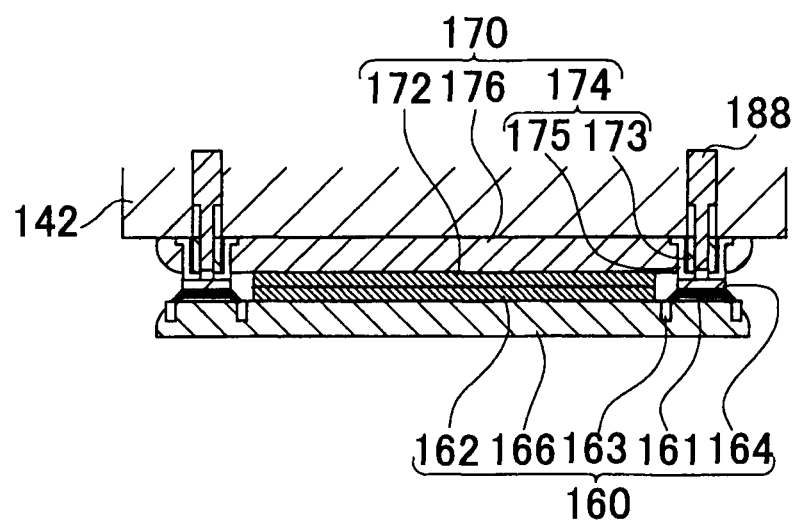
FIG. 44 shows the operation of the substrate bonding apparatus 100 shown in FIG. 43.

FIG. 44 shows operation of the substrate bonding apparatus 100 shown in FIG. 43. As shown in FIG. 44, by raising the push pin 188 relative to the second fixing member holding member 142, the restriction on the member to be joined 164 is removed so that the member to be joined 164 is adhered to the joining member 174.

Furthermore, the attractive force exerted on the member to be joined 164 by the joining member 174 deforms the flat spring 161. As a result, the biasing force of the flat spring 161 attempting to return the flat spring 161 to the original shape acts to pull the first fixing member 166 toward the second fixing member 176. Accordingly, the first substrate 162 and the second substrate 172 sandwiched between the first fixing member 166 and the second fixing member 176 are pressed together to be bonded.

Therefore, the adhesion between the member to be joined 164 and the joining member 174 can be restricted until the alignment of the first fixing member 166 and the second fixing member 176 is complete. Furthermore, while the member to be joined 164 is being attracted and adhered to the joining member 174, the movement speed of the first substrate assembly 160 is controlled to decrease the shock experienced at the moment of adhesion.

A drive unit for raising and lowering the push pin 188 is not shown in FIG. 44, but any hydraulic or electromagnetic actuator may be used. It should be noted that, in consideration of the function of restricting the adhesion of the member to be joined 164 against the attractive force between the joining member 174 and the member to be joined 164, an actuator with sufficient force at rest to resist the adhesion force is desirable.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A substrate bonding method for aligning and layering a pair of substrates, comprising:
holding one of the pair of substrates with a first holding member that has a member to be joined;
holding the other of the pair of substrates to face the one of the substrates with a second holding member that has a joining member exerting a joining force on the member to be joined;
aligning the pair of substrates;
layering the pair of substrates, such that the aligned pair of substrates make direct contact and are held in a layered state between the first holding member and the second holding member;
using the joining force to make contact between the member to be joined and the joining member in order to join the member to be joined and the joining member, the contact between the member to be joined and the joining member being made after the layering of the pair substrates; and
restricting a magnitude of the joining force during at least one of the aligning and the layering of the pair of substrates, such that the joining force applied to the member to be joined and the joining member is reduced.

2. A layered substrate manufacturing method, comprising, after performing the substrate bonding process according to claim 1, applying pressure to the substrates via the first holding member and the second holding member to attach the substrates to each other.

3. The substrate bonding method according to claim 1, further comprising:
restricting the joining force during the aligning of the pair of substrates.

4. The substrate bonding method according to claim 3, wherein
during the restricting, the joining force is restricted until the pair of substrates are aligned.

5. The substrate bonding method according to claim 3, wherein
after the aligning of the pair of substrates, the restricting of the joining force is removed, and the member to be joined and the joining member are joined to each other by the joining force.

6. The substrate bonding method according to claim 3, wherein
during the restricting, a restricting section is used that moves in a direction of a drive created by an alignment driving section, while contacting the joining member or the member to be joined.

7. The substrate bonding method according to claim 3, wherein
during the restricting, a state is maintained in which one of the joining member and the member to be joined is distanced from the other.

8. The substrate bonding method according to claim 3, wherein
during the restricting, the joining of the member to be joined is controlled by restricting elastic deformation of an elastic material that elastically supports the joining member or the member to be joined.

9. The substrate bonding method according to claim 3, wherein
the member to be joined includes a magnetic body,
the joining member includes a magnet, and
during the restricting, a restricting section that is formed of a material with higher magnetic permeability than the magnetic body distances a magnetic field generated by the joining member from the member to be joined, until a distance between the member to be joined and the joining member becomes a prescribed distance.

10. The substrate bonding method according to claim 3, further comprising applying pressure to the layered pair of substrates via the first holding member and the second holding member.

11. The substrate bonding method according to claim 1, wherein
the joining force includes an adhesion force.

12. The substrate bonding method according to claim 11, wherein the pair of substrates are semiconductor substrates that each include elements and electrodes, the aligning includes aligning corresponding electrodes of the semiconductor substrates, and the method further comprises applying pressure to the semiconductor substrates via the first holding member and the second holding member to attach the semiconductor substrates to each other.

13. The substrate bonding method according to claim 11, wherein the restricting includes restricting the magnitude of the adhesion force, an amount of restricting is based on a distance between the pair of substrates during at least one of the aligning and the layering of the pair of substrates to reduce an impact upon contact between the member to be joined and the joining member.

14. The substrate bonding method according to claim 1, wherein during the restricting the magnitude of the joining force, a distance is maintained between the joining member and the member to be joined.

15. The substrate bonding method according to claim 1, wherein the restricting the magnitude of the joining force changes a magnetic field generated at the joining member.

16. The substrate bonding method according to claim 1, wherein the restricting includes restricting the magnitude of the joining force, an amount of restricting is based on a distance between the pair of substrates during at least one of the aligning and the layering of the pair of substrates to reduce an impact upon contact between the member to be joined and the joining member.

* * * * *